(12) United States Patent
Shimoida et al.

(10) Patent No.: US 7,183,575 B2
(45) Date of Patent: Feb. 27, 2007

(54) HIGH REVERSE VOLTAGE SILICON CARBIDE DIODE AND METHOD OF MANUFACTURING THE SAME HIGH REVERSE VOLTAGE SILICON CARBIDE DIODE

(75) Inventors: Yoshio Shimoida, Yokosuka (JP); Saichirou Kaneko, Yokosuka (JP); Hideaki Tanaka, Yokosuka (JP); Masakatsu Hoshi, Yokohama (JP); Kraisom Throngnumchai, Yokohama (JP); Teruyoshi Mihara, Yokosuka (JP); Tetsuya Hayashi, Yokosuka (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/368,016

(22) Filed: Feb. 19, 2003

(65) Prior Publication Data

US 2004/0031971 A1 Feb. 19, 2004

(30) Foreign Application Priority Data

| Feb. 19, 2002 | (JP) | .............................. 2002-041667 |
| Feb. 19, 2002 | (JP) | .............................. 2002-041729 |
| Oct. 1, 2002 | (JP) | .............................. 2002-288500 |
| Oct. 10, 2002 | (JP) | .............................. 2002-297032 |

(51) Int. Cl.
*H01L 29/15* (2006.01)

(52) U.S. Cl. .................. 257/77; 257/173; 257/177; 438/749; 438/750

(58) Field of Classification Search .................. 257/77, 257/173, 177, 485–486, 471–476, 492, 603; 438/749–752
See application file for complete search history.

(56) References Cited

U.S. PATENT DOCUMENTS

| 5,298,766 A | * | 3/1994 | Kobashi et al. ................ 257/77 |
| 5,371,382 A | * | 12/1994 | Venkatesan et al. ........... 257/77 |
| 5,633,194 A | * | 5/1997 | Selvakumar et al. ......... 117/103 |
| 5,929,523 A | * | 7/1999 | Parsons ....................... 257/750 |
| 6,440,823 B1 | * | 8/2002 | Vaudo et al. ................ 438/478 |
| 6,518,197 B2 | * | 2/2003 | Hirose ......................... 438/749 |
| 6,576,973 B2 | * | 6/2003 | Collard et al. .............. 257/483 |

FOREIGN PATENT DOCUMENTS

| JP | 63-156367 | 6/1988 |
| JP | 05-102497 | 4/1993 |
| JP | 5-136015 | 6/1993 |
| JP | 09-172159 | 6/1997 |

OTHER PUBLICATIONS

Partial English translation of Japanese application No. 9-172159.*

* cited by examiner

*Primary Examiner*—Douglas W. Owens
(74) *Attorney, Agent, or Firm*—McDermott Will & Emery LLP

(57) ABSTRACT

A high reverse voltage diode includes a hetero junction made up from a silicon carbide base layer, which constitutes a first semiconductor base layer, and a polycrystalline silicon layer, which constitutes a second semiconductor layer, and whose band gap is different from that of the silicon carbide base layer. A low concentration N type polycrystalline silicon layer is deposited on a first main surface side of the silicon carbide base layer, and a metal electrode is formed on a second main surface side of the silicon carbide base layer which is opposite to the first main surface side thereof.

41 Claims, 20 Drawing Sheets

HIGH REVERSE VOLTAGE SILICON CARBIDE DIODE AND METHOD OF MANUFACTURING THE SAME HIGH REVERSE VOLTAGE SILICON CARBIDE DIODE

BACKGROUND OF THE INVENTION

1. Field of the Invention

The present invention relates to a high reverse voltage silicon carbide diode, and to a method of manufacturing the same high reverse voltage silicon carbide diode.

2. Description of the Related Art

A PN junction and a Schottky junction are per se known as prior art junctions for providing a high reverse voltage diode consisted of silicon carbide. It is necessary to form a deep diffusion region in order to obtain a high voltage capability by providing a PN junction to silicon carbide. Due to this, it is necessary to introduce the impurity by high energy ion implantation.

SUMMARY OF THE INVENTION

However, defects are generated in the silicon carbide when the high energy ion implantation is performed, and this can easily become a cause for increase of the leakage current.

It would be desirable to provide a high reverse voltage silicon carbide diode and a method of manufacturing the same high reverse voltage diode.

A high reverse voltage diode according to the present invention comprises a hetero junction which is made up from a first semiconductor base layer and a second semiconductor layer whose band gap is different from that of the first semiconductor base layer.

A method of manufacturing a high reverse voltage diode according to the present invention comprises cleaning a first main surface side of the first semiconductor base layer, depositing a second semiconductor layer upon the first main surface of the first semiconductor base layer, doping an impurity into the second semiconductor layer and etching the second semiconductor layer selectively.

DETAILED DESCRIPTION OF THE PREFERRED EMBODIMENTS

In the following, various preferred embodiments of the present invention will be explained in detail with reference to the drawings. It is to be noted that, in the following explanation and in the figures, elements which have the same functions are denoted by the same reference numbers, and repetitive explanation thereof has been curtailed in the interests of brevity of description.

The First Preferred Embodiment

Figure 1:
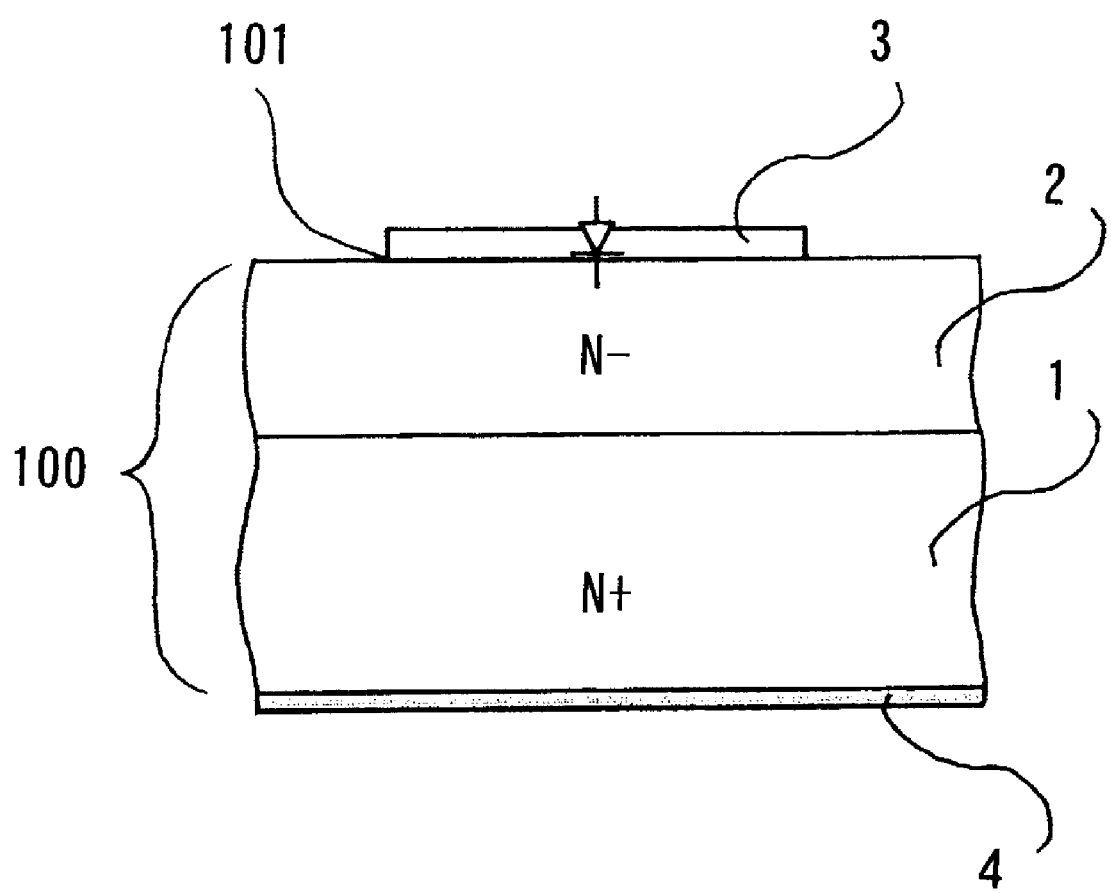
FIG. 1 is a cross sectional structural view of a semiconductor device in a first preferred embodiment according to the present invention.

FIG. 1 is a cross sectional structural view of a high reverse voltage silicon carbide diode in a first preferred embodiment according to the present invention. An epitaxial layer 2 made of low concentration N type silicon carbide (SiC) is formed upon a silicon carbide substrate 1 which consists of high concentration N type silicon carbide. A substrate of resistivity from a few to several dozen mΩcm and of thickness 200 to 400 µm may, for example, be used as the silicon carbide substrate 1. A region with an N type impurity concentration of $10^{15}$ to $10^{18}$ cm$^{-3}$ and of thickness from a few to several dozen µm may, for example, be used as the epitaxial layer 2. Although in this first preferred embodiment, by way of example, the case of a silicon carbide base layer 100 made by forming the epitaxial layer 2 upon the silicon carbide substrate 1 is explained, the silicon carbide base layer 100 which is formed only from the silicon carbide substrate 1 may be employed, irrespective of the magnitude of its specific resistance. Furthermore, although 4H is typical as the polytype of the silicon carbide to be used here, other polytypes such as 6H or 3C or the like may be employed.

A polycrystalline silicon layer 3 whose band gap is narrower than that of silicon carbide is deposited upon one portion of the surface of the epitaxial layer 2. Impurity is introduced in this polycrystalline silicon layer 3, for example, and in this case it is doped to achieve N type low concentration.

A metal electrode 4 is formed on the rear surface side of the silicon carbide substrate 1. This metal electrode 4 is provided to achieve ohmic contact with the silicon carbide substrate 1. A layer of Ti (titanium) of thickness about 5000 Å with a layer of Ni (nickel) of thickness about 3000 Å deposited on it may be used as the metal material which is used for the metal electrode 4. In this way, with the high reverse voltage silicon carbide diode according to the first preferred embodiment of the present invention, a vertical diode is constituted, with the polycrystalline silicon layer 3 serving as the anode and the metal electrode 4 serving as the cathode.

Next, the operation of this high reverse voltage silicon carbide diode according to the first preferred embodiment will be explained.

When a voltage is applied between both of the metal electrode which is serving as the cathode and the polycrystalline silicon layer 3 which is serving as the anode, a rectifying action occurs in the junction boundary surface between the polycrystalline silicon layer 3 and the silicon carbide epitaxial layer 2, and accordingly diode characteristics are obtained. According to the results of experiments performed by the present inventors, if the polycrystalline silicon layer 3 is made to be N type low concentration and the N type silicon carbide epitaxial layer 2 is made to be of concentration approximately $10^{16}$ cm$^{-3}$ and of thickness approximately 10 µm, irrespective of whether or not any special edge termination technique is employed, a diode reverse bias voltage capability of approximately 900 V is obtained.

Figure 15:
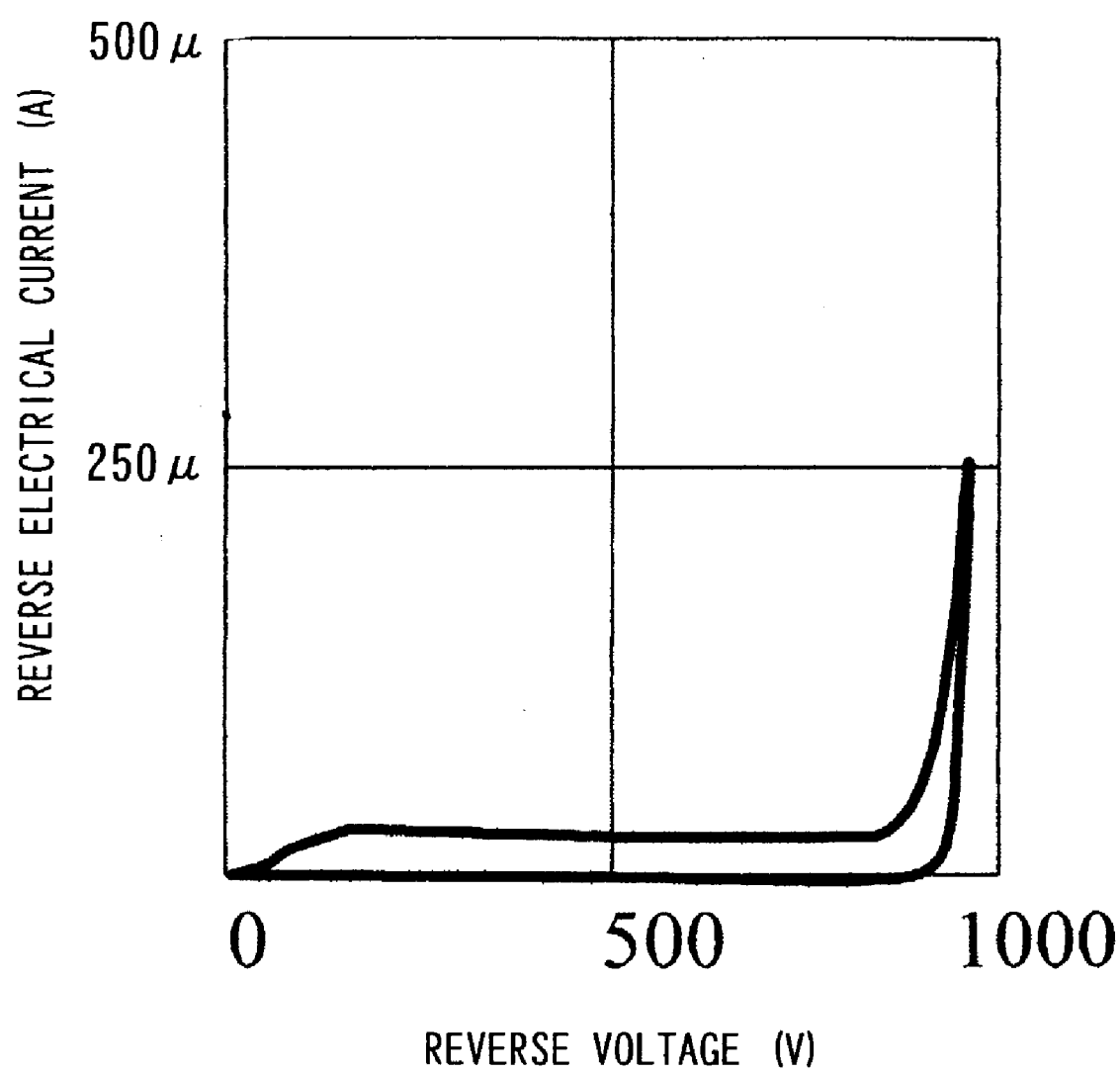
FIG. 15 is a reverse bias I–V characteristics diagram of a diode, which has been obtained as a result of experiment.

FIG. 15 is a figure showing the reverse bias current—voltage characteristics of the junction of a high reverse voltage silicon carbide diode according to the first preferred embodiment of the present invention, which was measured using a curve tracer. The value of the applied voltage in the reverse direction is shown along the horizontal axis, while the value of the current flowing is shown along the vertical axis. It will be seen that, even when voltage is applied in the reverse direction, hardly any current flows, and the leakage current is very low. According to the experiments performed by the present inventors, the result was obtained that, when a high voltage greater than 900 V was applied, an current suddenly flowed in the reverse direction. In other words, the result of the experiments shows a reverse bias voltage capability of more than 900 V.

Furthermore, according to the experiments performed by the present inventors, the same diode characteristics were obtained even when the polycrystalline silicon layer 3 was made to be N type high concentration, and the silicon carbide side was made in the same conditions as the above described conditions. In this case, the reverse bias voltage capability of the diode was found to be approximately 100 V.

At this time, the voltage drop Vf which was equivalent to the forward bias characteristics of the diode varies according to the type and the concentration of impurity in the polycrystalline silicon layer 3, and any value between about 0.2 V and 2.0 V can be obtained.

In this manner, our experiments have been the first to discover that, for a junction between silicon carbide and polycrystalline silicon, a diode characteristics just like that of a Schottky junction is exhibited, and that a reverse bias voltage capability close to 1000 V can be obtained.

The operation of the high reverse voltage silicon carbide diode according to the first preferred embodiment of the present invention will now be explained based upon the results of the above experiments, with reference to FIGS. 11~14. FIGS. 11~14 are figures showing the band structure of this semiconductor.

Figure 11:
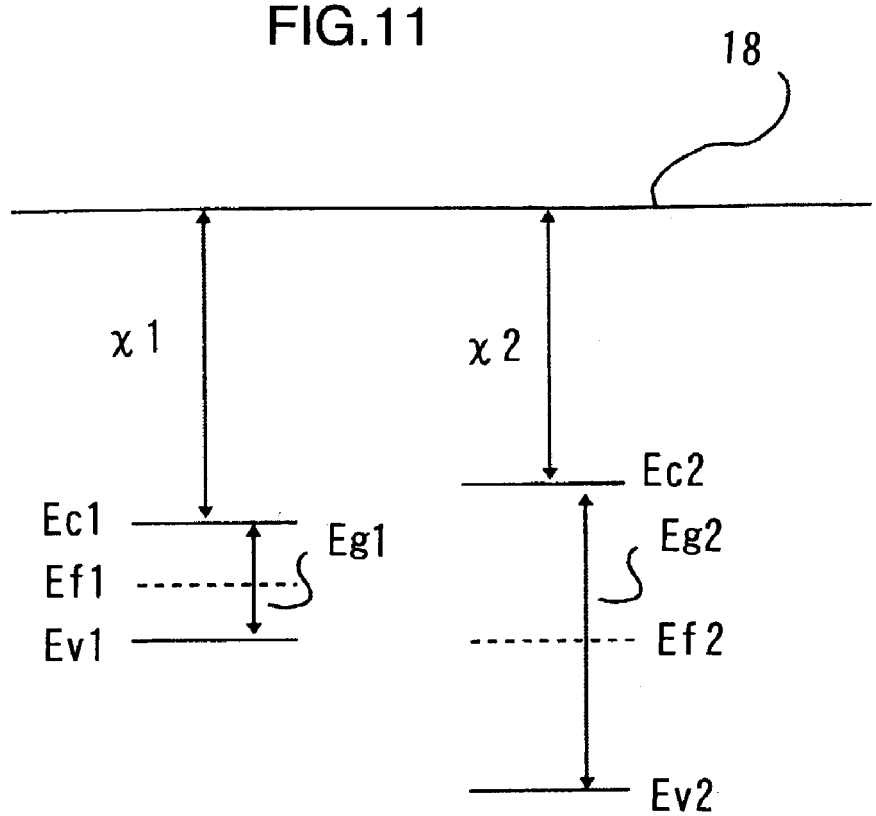
FIG. 11 is an energy band diagram for explanation of the theory of operation of the present invention.

In FIG. 11, the left side shows an energy-band diagram of polycrystalline silicon, while the right side shows an energy-band diagram of silicon carbide (4H-SiC), in the state in which they do not contact one another. With respect to the vacuum level 18, the electron affinity of the polycrystalline silicon is taken as $\chi 1$, while its band gap is taken as Eg1. In the same manner, the electron affinity of the silicon carbide is taken as $\chi 2$, while its band gap is taken as Eg2. Since in this case the electron affinities and the band gaps of the two of them are different, it is possible to assume a band structure as shown in FIG. 11. The bottom Ec1 of the conduction band of the polycrystalline silicon is at a lower energy level than the bottom Ec2 of the conduction band of the silicon carbide, and the upper limit Ev1 of the valence band of the polycrystalline silicon is at a higher level than the upper limit Ev2 of the valence band of the silicon carbide.

The Fermi level Ef1 of the polycrystalline silicon is determined by the impurity concentration, and is, for example, the level shown in FIG. 11. Furthermore, the Fermi level Ef2 of the silicon carbide is determined by the impurity concentration, and is, for example, the level shown in FIG. 11.

Figure 12:
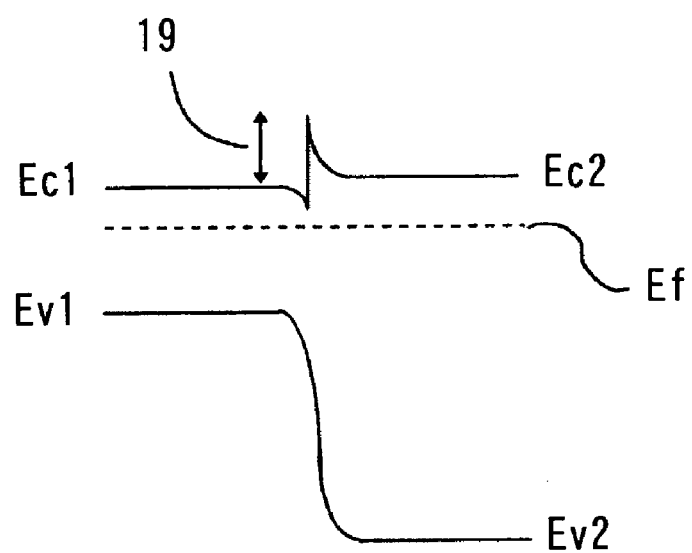
FIG. 12 is an energy band diagram of an N type high concentration polycrystalline silicon and silicon carbide junction according to the present invention.

When the two of these are put into contact, the state of the energy bands becomes as shown in FIG. 12. It is to be noted that the impurity in the polycrystalline silicon are assumed to be N type, and also the impurity in the silicon carbide are assumed to be N type.

Figure 13:
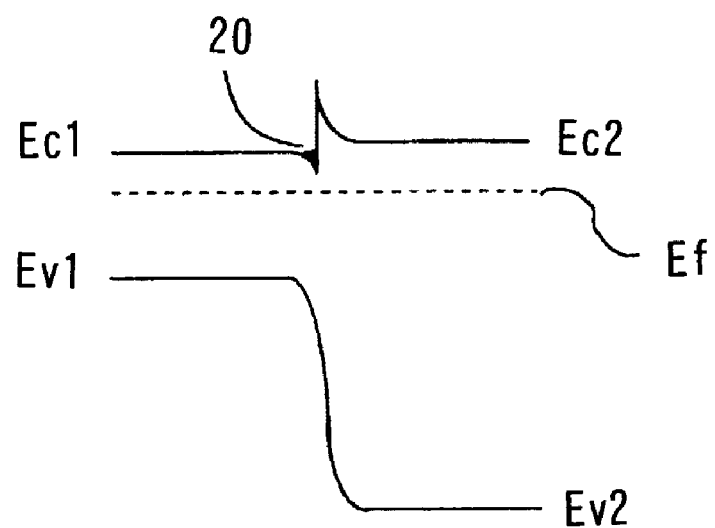
FIG. 13 is an energy band diagram of an N type high concentration polycrystalline silicon and silicon carbide junction according to the present invention.

When the two of these are put into contact, their Fermi levels Ef are made to agree with one another. Accordingly, the bottom levels of their conduction bands come to be related as shown in FIG. 12. At this time, the energy difference between the bottom Ec1 of the conduction band of the polycrystalline silicon and the peak value at the top of the energy band diagram exists as a potential barrier 19 in the forward direction of the diode. On the side of the polycrystalline silicon, electrons 20 are generated by the built in potential (the diffusion potential) of the junction, and they accumulate at the interface with the polycrystalline silicon side. FIG. 13 is a figure showing these electrons.

A depletion layer due to the built in potential extends over the silicon carbide side. Here, it is necessary for the electric line of force which corresponds to this depletion layer which is expanded on the silicon carbide side to terminate in the polycrystalline silicon side, and the electrons 20 satisfy this requirement. In other words, the electric line of force is terminated upon the electrons 20, and the polycrystalline silicon side is shielded by this electric field. In actual fact, almost no high electric field is applied to the polycrystalline silicon side.

Next, the reverse bias characteristics of this diode will be explained. When a positive voltage is applied to the cathode side (the silicon carbide side) with respect to the anode side (the polycrystalline silicon side), the depletion layer is expanded into the silicon carbide side from the interface of the junction. Although the electrons 20 are attracted to the cathode side, the electrons 20 accumulate at the interface, since as shown in FIG. 12 the potential barrier 19 exists at the interface.

Figure 14:
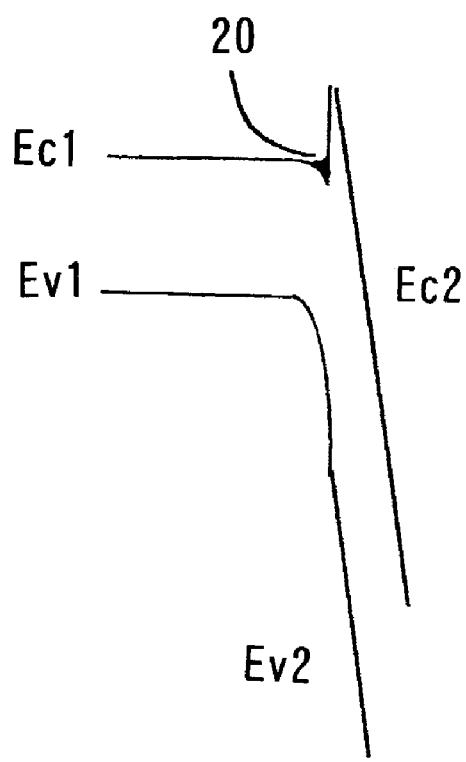
FIG. 14 is an energy band diagram of an N type low concentration polycrystalline silicon and silicon carbide junction according to the present invention.

FIG. 14 is a figure showing the calculated results for the energy band diagram when 500 V is applied to the cathode side. Even though a high voltage is applied to the cathode, the potential barrier of the interface between the polycrystalline silicon and the silicon carbide remains. Due to this, even if a fairly high voltage is applied to the cathode, it does not happen that breakdown is first engendered in the polycrystalline silicon, so that it becomes possible for the reverse bias voltage capability to be determined by the structure of the silicon carbide side. The above is the reason why the reverse bias voltage capability like that of a Schottky junction is obtained with a combination of N type polycrystalline silicon and N type silicon carbide. Furthermore, the fact that the reverse bias voltage capability is dependent upon the concentration of the N type impurity in the polycrystalline silicon is a fact obtained by experiment. Accordingly, with the high reverse voltage silicon carbide diode according to the first preferred embodiment of the present invention, the result is obtained that, by varying the impurity concentration in the polycrystalline silicon, it is possible to vary the reverse bias voltage capability and the forward bias characteristics of the junction.

A Variant of the First Preferred Embodiment

Although the above explanation was made in terms of an impurity being introduced into the polycrystalline silicon layer 3, it would also be possible to obtain the same results by not introducing any impurity, in other words in the so called non doped case. Furthermore, it would also be possible to obtain the same results by performing the doping at high concentration, or by performing P type doping.

Moreover, in the above discussion, the case of manufacturing a high reverse voltage silicon carbide diode using N type polycrystalline silicon and N type silicon carbide was explained. In the case of the polycrystalline silicon being P type, or of the silicon carbide being P type, the corresponding different band structure must be assumed.

Figure 2:
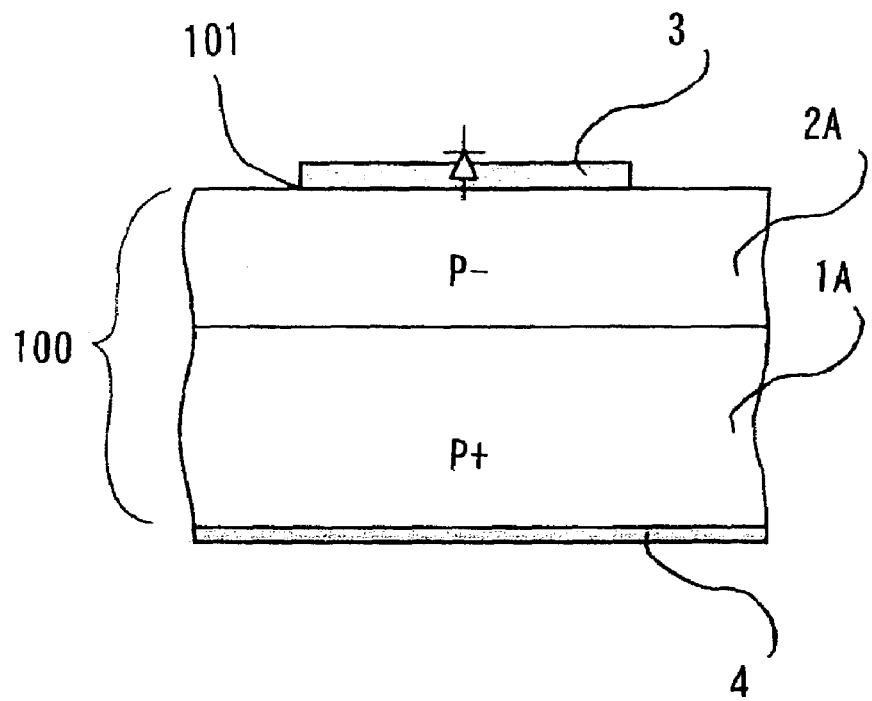
FIG. 2 is a cross sectional structural view of another semiconductor device according to the first preferred embodiment of the present invention, which has a different structure.

As shown in FIG. 2, it is also possible to utilize a structure in which a P type low concentration silicon carbide epitaxial layer 2A is formed upon a P type high concentration silicon carbide substrate 1A, and a P type polycrystalline silicon layer 3 is deposited on top of a portion thereof. In this case as well, in the so called non doped case in which no impurity is introduced in the polycrystalline silicon layer 3, it is possible to obtain the same beneficial results as in the case in which the doping is performed at high concentration, and furthermore as in the case in which N type doping is performed.

It is to be noted that, with the high reverse voltage silicon carbide diode in the first preferred embodiment according to the present invention, a hetero junction 101 is constituted by the first semiconductor base layer (the silicon carbide base layer 100) and the second semiconductor layer (the polycrystalline silicon layer 3) whose band gap is different from that of the first semiconductor base layer (the silicon carbide base layer 100). The first semiconductor base layer is made of, for example, a silicon carbide base layer, and the second semiconductor layer is made of at least one of, for example, silicon, amorphous silicon, or polycrystalline silicon. In the above explanation, the second semiconductor layer is a polycrystalline silicon layer 3.

According to the high reverse voltage silicon carbide diode in the first preferred embodiment of the present invention, it is possible to obtain a reverse bias voltage capability with a simple structure. Furthermore, it is not necessary to perform high energy ion implantation, and also no defects such as damage or the like are introduced, and it is possible to perform the manufacturing process simply. Yet further, it is not necessary to perform high temperature annealing at a temperature of 1600° C. or more for crystallinity recovery, and no deterioration of surface morphology (surface roughness) occurs.

Furthermore, the hetero junction 101 is constituted by the second semiconductor layer (the polycrystalline silicon layer 3) being formed upon the first main surface side of the first semiconductor base layer (the silicon carbide base layer 100), and the metal electrode 4 is formed on a second main surface side opposite to the first main surface of the first semiconductor base layer (the silicon carbide base layer 100). According to this type of construction, it is possible to implement a vertical type high reverse voltage diode of a highly integrated type with the hetero junction 101, which is provided with a conventional silicon carbide substrate. Furthermore it has the distinguishing feature that it is possible to vary the height of the potential barrier as desired by varying the impurity concentration in the polycrystalline silicon layer 3, and in this respect it is different from a prior art type Schottky junction. By doing this, it is possible to control the voltage drop Vf of the diode freely, so that it is possible to anticipate wide application of this device as a semiconductor component.

Figure 9A:
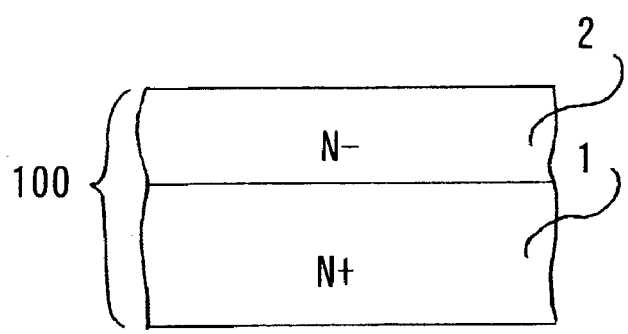
FIGS. 9A through 9F are cross sectional structural views showing a method of manufacture for the semiconductor devices according to the first and second preferred embodiments of the present invention.

A Method of Manufacture of the High Reverse Voltage Silicon Carbide Diode According to the First Preferred Embodiment A method of manufacturing this high reverse voltage silicon carbide diode in the first preferred embodiment according to the present invention will now be explained with reference to FIGS. 9A–9F. As shown in FIG. 9A, a silicon carbide base layer 100 is prepared by forming an N type low concentration silicon carbide epitaxial layer 2 upon an N type high concentration silicon carbide substrate 1. After the surface of this epitaxial layer 2 has been cleaned by stripping off, for example, a thin sacrificial oxide layer, it is cleaned by a per se conventional process such as RCA cleaning or the like.

Figure 9D:
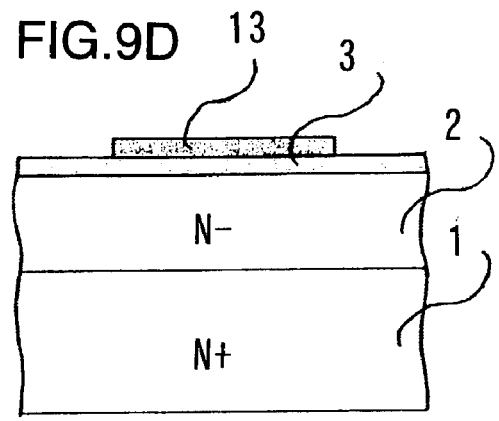
Figure 9B:
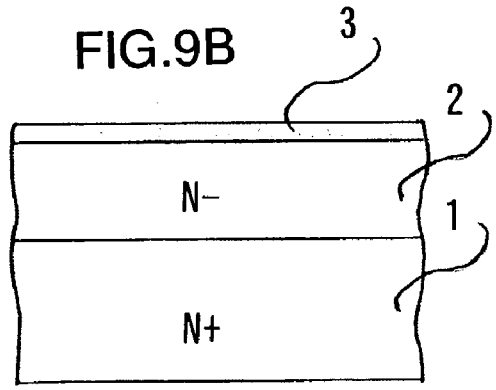

In FIG. 9B, there is shown the process of depositing a polycrystalline silicon layer 3 upon this silicon carbide base layer 100. The thickness of the polycrystalline silicon layer 3 may suitably be, for example, from a few tens to a few thousands of Å.

Figure 9E:
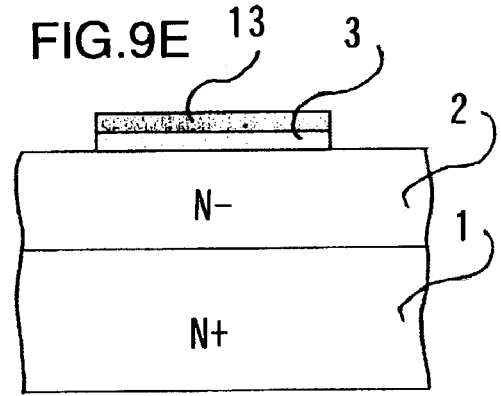
Figure 9C:
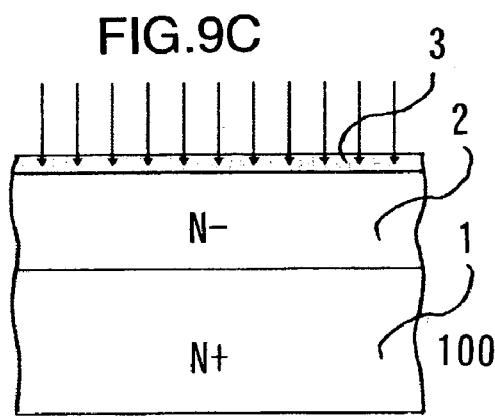

In FIG. 9C, there is shown a process of introducing the desired impurity into this polycrystalline silicon layer 3. In this process of introducing the impurity into this polycrystalline silicon layer 3, a solid phase diffusion method is available. In the solid phase diffusion method, a deposition layer doped at high impurity concentration is formed on the polycrystalline silicon layer 3 and the impurity is introduced into the polycrystalline silicon layer 3 by diffusion from the deposition layer as a source of diffusion. Furthermore, it would also be acceptable to introduce the impurity through a screen film into the polycrystalline silicon layer 3 by ion implantation method. Yet further, it would also be possible to introduce the impurity from the vapor phase. In this case, it is possible to utilize a per se conventional vapor phase diffusion method. In concrete terms, the impurity is introduced in a diffusion furnace as a gas along with a carrier gas. The proportion of the gas may be accurately controlled by a gas-mixing device which is equipped with a mass flow controller. For the carrier gas, generally an inert-gas such as argon or the like is employed.

In FIG. 9D, there is shown a process of patterning a mask 13 upon the polycrystalline silicon layer 3.

In FIG. 9E, there is shown a process of etching the portions of the polycrystalline silicon layer 3 which are not covered by the mask 13.

Figure 9F:
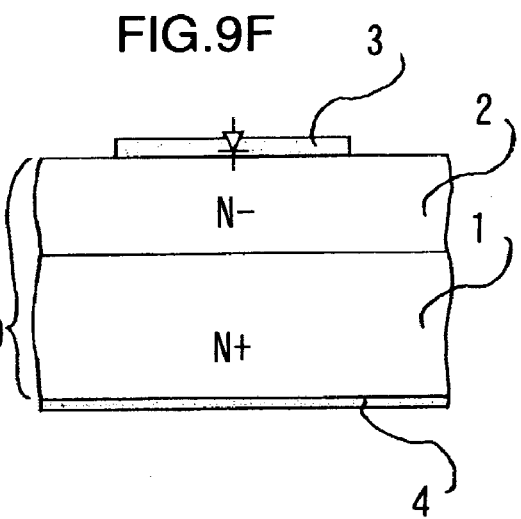

In FIG. 9F, there is shown a process of eliminating the mask 13 from above the polycrystalline silicon layer 3, and also forming the metal electrode 4 upon the rear surface of the silicon carbide base layer 100. RTA (Rapid Thermal Annealing) is performed at a temperature of approximately 1000° C., according to requirements, so as to implement ohmic contact between the metal electrode 4 and the silicon carbide substrate 1.

It is to be noted that the method of manufacturing the high reverse voltage silicon carbide diode in the first preferred embodiment according to the present invention shown in FIGS. 9A through 9F comprises the process (FIG. 9A) of cleaning the first main surface side of the first semiconductor base layer (the silicon carbide base layer 100), the process (FIG. 9B) of depositing the polycrystalline silicon layer 3 upon this first main surface, the process (FIG. 9C) of introducing an impurity into this polycrystalline silicon layer 3, and the processes (FIGS. 9D and 9E) of selectively etching the polycrystalline silicon layer 3.

It is possible easily to form the high reverse voltage silicon carbide diode shown in FIGS. 1 and 2 according to such a method of manufacture.

Furthermore, the process of introducing an impurity shown in FIG. 9C may be performed by introducing the impurity from a deposition layer which has been doped at high impurity concentration, or by introducing the impurity with ion implantation, or by introducing the impurity from the vapor phase; and impurities of different types, or at different concentrations, may be introduced at different desired regions of the polycrystalline silicon layer 3. By doing this, it is possible easily to form the polycrystalline silicon layer of the desired concentration.

If this method of manufacturing the high reverse voltage silicon carbide diode in the first preferred embodiment according to the present invention is employed, it is possible to form the high reverse voltage diode by a simple manufacturing process. Furthermore, there is the special beneficial effect that there is no loss of the diode characteristics, even if a heat process at a temperature of approximately 1000° C. is introduced after forming the junction between the polycrystalline silicon and the silicon carbide.

The Second Preferred Embodiment

Figure 3:
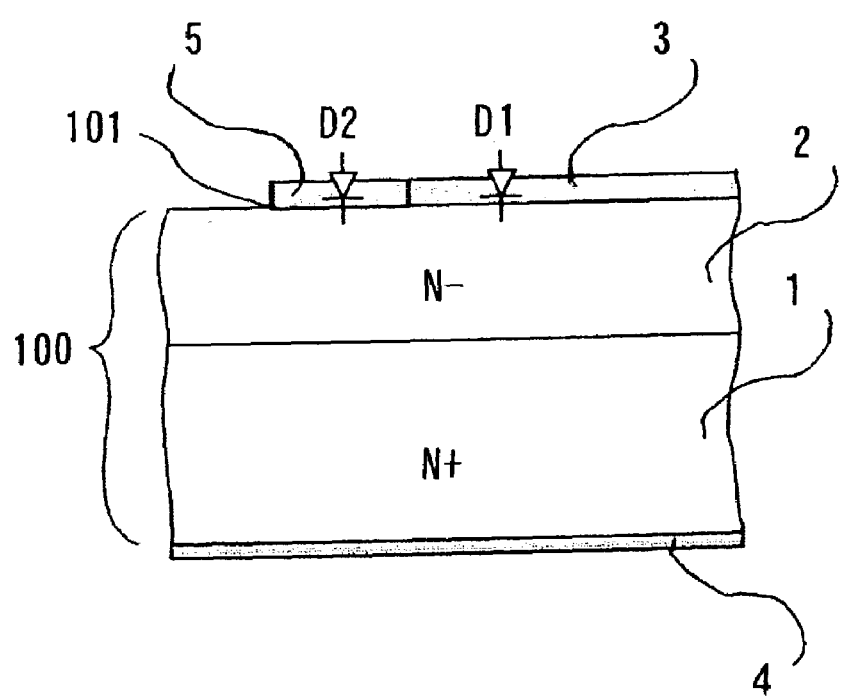
FIG. 3 is a cross sectional structural view of a semiconductor device in a second preferred embodiment according to the present invention.

The second preferred embodiment of the high reverse voltage silicon carbide diode according to the present invention will now be explained with reference to FIG. 3. FIG. 3 shows the cross sectional structure of the high reverse voltage silicon carbide diode in this second preferred embodiment. The explanation of structural portions thereof which are the same as corresponding structural portions of the high reverse voltage silicon carbide diode in the first preferred embodiment shown in FIG. 1 will be curtailed.

As shown in FIG. 3, an epitaxial layer 2 made of low concentration N type silicon carbide is formed upon a silicon carbide substrate 1 which consists of high concentration N type silicon carbide. The structures of the silicon carbide substrate 1 and the epitaxial layer 2 are the same as those employed for the corresponding portions of the high reverse voltage silicon carbide diode in the first preferred embodiment shown in FIG. 1. A polycrystalline silicon layer 3 whose band gap is narrower than that of silicon carbide is deposited upon one portion of the surface of the epitaxial layer 2. Furthermore, a metal electrode 4 is formed on the rear surface side of the silicon carbide substrate 1. The structure of the polycrystalline silicon layer 3 and the metal electrode 4 are also the same as those employed for the corresponding portions of the high reverse voltage silicon carbide diode in the first preferred embodiment shown in FIG. 1.

The characteristic feature of the structure of this high reverse voltage silicon carbide diode in the second preferred embodiment according to the present invention is that a polycrystalline silicon layer 5 is formed so as to surround the polycrystalline layer 3, in which the type of the impurity and/or the impurity concentration is different. In concrete terms, a polycrystalline silicon layer 5, having a concentration which is lower, for example, than that of the polycrystalline silicon layer 3, is formed around the circumference of the N type polycrystalline silicon layer 3, so that the breakdown voltage comes to be higher than that of the hetero junction between the polycrystalline silicon layer 3 and the epitaxial layer 2. In other words, a diode D1 which is constituted by the N type polycrystalline silicon layer 3 and the silicon carbide, and a diode D2 which is constituted by the surrounding N type low concentration polycrystalline silicon layer 5 and the silicon carbide, are formed so as to be electrically connected in parallel.

Next, the operation of this high reverse voltage silicon carbide diode according to the second preferred embodiment of the present invention will be explained.

The basic operation as a diode is the same as that explained above with respect to the first preferred embodiment. Here, only the features of the operation of this high reverse voltage silicon carbide diode which are peculiar to the second preferred embodiment of the present invention will be explained.

With a prior art type diode incorporating a PN junction or a Schottky junction, it is easy for the electric field to be concentrated at the outermost periphery of the active region, and this can easily be a cause of reduction of the reverse bias voltage capability or of increase of the leakage current. However, with this high reverse voltage silicon carbide diode according to the second preferred embodiment of the present invention, the breakdown voltage of the outer peripheral portion of the hetero junction is high, since the N type low concentration polycrystalline silicon layer 5 which has a high reverse bias voltage capability as shown in FIG. 15 is deposited around the outer peripheral portion of the diode. To put it in another way, even if a voltage is applied to the diode in the reverse direction, and the electric field at the hetero junction interface at the outermost peripheral portion of the diode becomes remarkably high, nevertheless increase of the reverse bias leakage current at the peripheral portion is suppressed, since the breakdown voltage of the hetero junction which is formed at the outer peripheral portion of the hetero junction is high.

Accordingly, the hetero junction between the N type low concentration polycrystalline silicon layer 5 and the silicon carbide functions as the edge termination. In other words, there are the beneficial results that a diode with the high reverse bias voltage capability can easily be produced, and that it becomes possible to simplify the manufacturing process therefor, since it is not necessary to perform any special edge termination technique at the outer peripheral portion with a PN junction or the like which needs to be formed within the silicon carbide.

With this high reverse voltage silicon carbide diode in the second preferred embodiment according to the present invention, it is possible to widen its range of application as an electronic device, since one advantageous feature of the present invention, for example, is that it is possible to establish any desired regions with different types of impurity or concentrations of such impurity in the interior portion of the same polycrystalline silicon layer (3, 5). Furthermore, it is possible selectively to form regions which have desired voltage resistances according to requirements; for example, it becomes possible to manufacture products which have a wide range of application, by forming upon the same silicon carbide base layer 100, a plurality of polycrystalline silicon layers which have different types of impurity and different concentrations of impurity, as individually desired, or the like.

A Variant of the Second Preferred Embodiment

Figure 4:
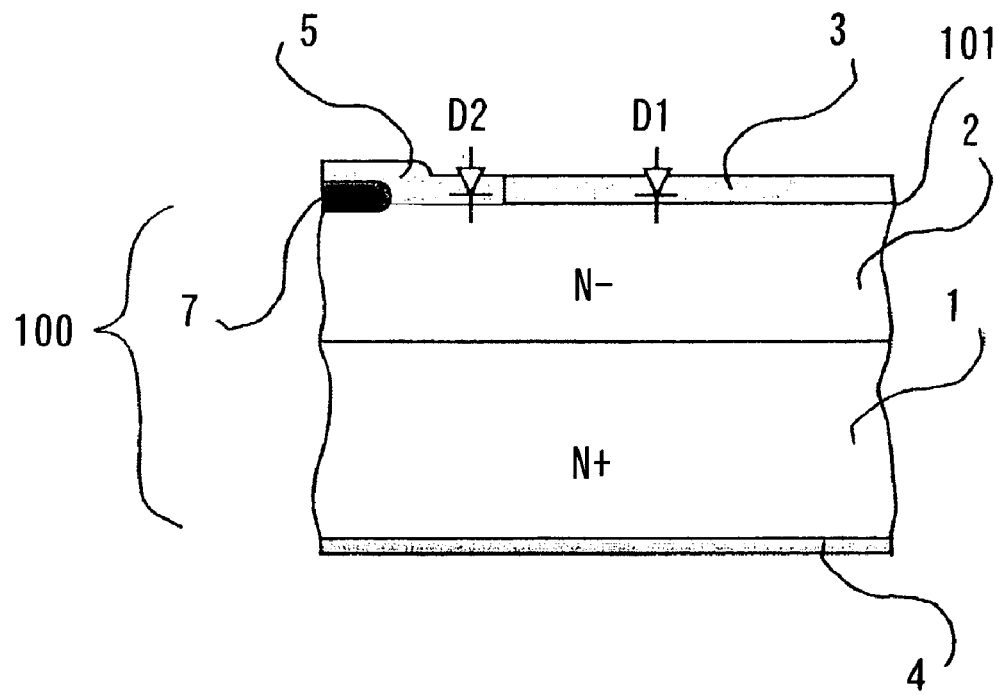
FIG. 4 is a cross sectional structural view of another semiconductor device according to the second preferred embodiment of the present invention, which has a variant structure.

FIG. 4 is a figure showing an example of a variant structure for the high reverse voltage silicon carbide diode according to the second preferred embodiment of the present invention. Since the basic structure is the same as the structure of the diode shown in FIG. 3, the explanation will focus upon the points of difference. The peripheral portion (the polycrystalline silicon layer 5 which has a lower concentration than the polycrystalline silicon layer 3) of the polycrystalline silicon layer which is deposited on the N type low concentration silicon carbide epitaxial layer 2 is formed upon an oxide film 7. In other words, the portion at the peripheral portion of the polycrystalline silicon layer which is directly contacted with the silicon carbide epitaxial layer 2 is made as N type low concentration (the polycrystalline silicon layer 5 which has a lower concentration than the polycrystalline silicon layer 3). According to this type of structure, by this combination with an extremely simple type of edge termination, it is also possible to perform further electric field intensity alleviation directly underneath the edge portion of the outermost periphery of the polycrystalline silicon layer.

The method of manufacturing the high reverse voltage silicon carbide diode according to the first preferred embodiment of the present invention can be applied as a method of manufacturing the high reverse voltage silicon carbide diode according to the second preferred embodiment of the present invention. In other words, it will be sufficient to provide a process, as shown in FIG. 9C, of introducing an impurity into the polycrystalline silicon layer 3 so that they have the desired concentration. In concrete terms, it is possible to perform introduction of the impurity from a deposition layer or from the vapor phase separately for the central portion and for the peripheral portion, or to perform ion implantation separately for the central portion of the polycrystalline silicon and for its peripheral portion.

It is to be noted that, although in the example which was explained an N type low concentration polycrystalline silicon layer 5 was used in the hetero junction of the peripheral portion of the diode, it would also be possible to utilize a non doped type whose reverse bias voltage capability is greater as compared with the hetero junction of the central portion, or a P type polycrystalline silicon layer.

Figure 20:
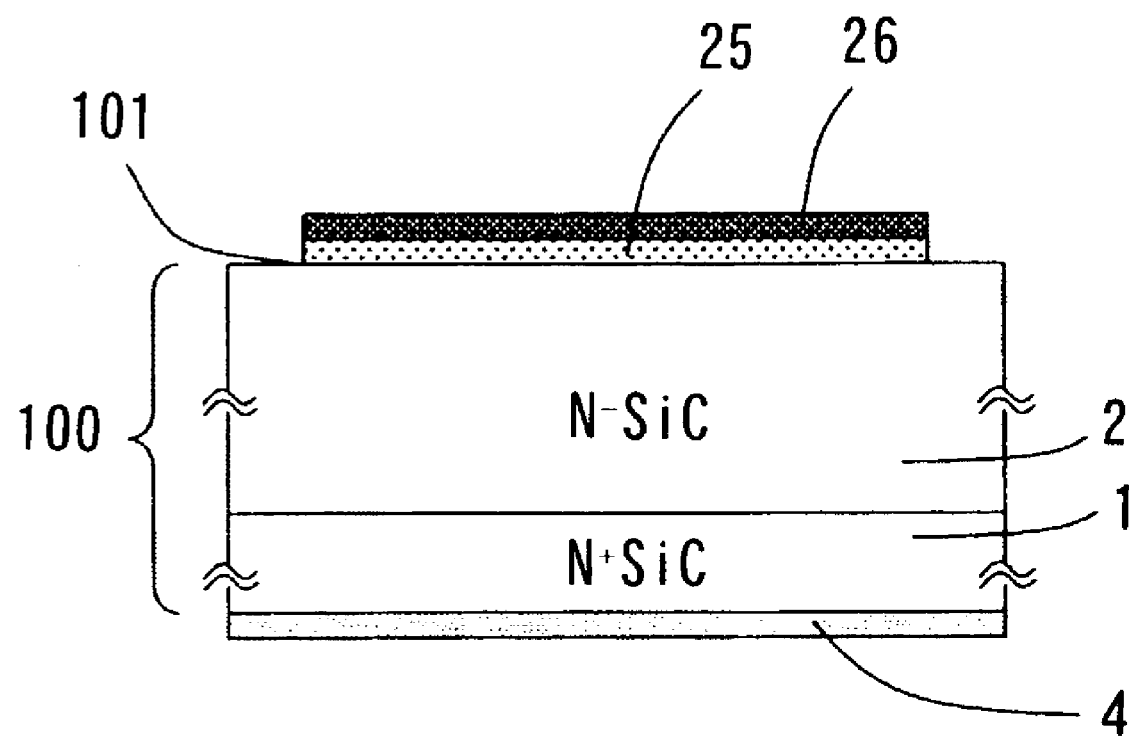
FIG. 20 is a cross sectional view of another semiconductor device according to the third preferred embodiment of the present invention, which has a variant structure.

As another embodiment, it is also possible to vary the type of the impurity or the impurity concentration in a layer pattern, as shown in FIG. 20. In the example shown in FIG. 20, an N type low concentration polycrystalline silicon layer 25 is disposed at the portion which contacts against the interface of the hetero junction 101, and over this polycrystalline silicon layer 25 there is superimposed an N type high concentration polycrystalline silicon layer 26. In other words, the voltage capability (the reverse bias characteristics) is maintained by forming the hetero junction with the N type polycrystalline silicon layer 25 whose reverse bias voltage capability is high, while it becomes possible to enhance the ON resistance (the forward bias characteristics) by forming, on the surface which contacts with the external electrode, the N type high concentration polycrystalline silicon layer 26 which is available to achieve an ohmic contact thereto. In this manner, the specific beneficial results of the present invention are also obtained for the case in which the type of the impurity or the impurity concentration is varied in layer form.

It is to be noted that, with this high reverse voltage silicon carbide diode in the second preferred embodiment according to the present invention, the second semiconductor layer (the polycrystalline silicon) has regions (the polycrystalline silicon layers 3 and 5) in which the type of the impurity and the impurity concentration are different. According to this type of structure, the junction between the N type low concentration polycrystalline silicon layer 5 and the silicon carbide functions as the edge termination, and, along with obtaining a diode with the high reverse bias voltage capability of a simple construction without utilizing any special peripheral edge termination technique for the PN junctions or the like within the silicon carbide, it also becomes possible to simplify the manufacturing process. Furthermore, it is possible to widen the range of application of this diode as an electronic component, since it is possible to establish any desired regions of different types of impurity or of different impurity concentration in the interior of the same polycrystalline silicon layer (3, 5), or in a plurality of polycrystalline silicon layers which are formed upon the same silicon carbide base layer 100. Furthermore, if the type of the impurity or the impurity concentration is varied in layer form, then, it is possible to maintain the voltage capability (the reverse bias characteristics), also ohmic contact with an external electrode becomes possible, so that it becomes possible to enhance the ON resistance (the forward bias characteristics).

Yet further, this diode is formed so that the type of the impurity or the impurity concentration within the second semiconductor layer (the polycrystalline silicon) differs in the central portion and in the peripheral portion (the polycrystalline silicon layer 3 and the polycrystalline silicon layer 5 which has a lower concentration than the polycrystalline silicon layer 3), or so that at least the breakdown voltage at the hetero junction with the peripheral portion (the polycrystalline silicon layer 5) should become great as compared with that at the hetero junction with the central portion (the polycrystalline silicon layer 3). According to this type of structure, since, for example, an N type low concentration polycrystalline silicon layer 5 is deposited around the periphery of the diode, the high reverse bias voltage capability is enhanced in this portion. In other words, even if a voltage is applied in the reverse direction of the diode, and in particular even if the electric field at the peripheral interface increases remarkably, nevertheless the reverse bias leakage current at the periphery is suppressed, since the high reverse bias voltage capability at the hetero junction at this peripheral portion is enhanced.

The Third Preferred Embodiment

Figure 5:
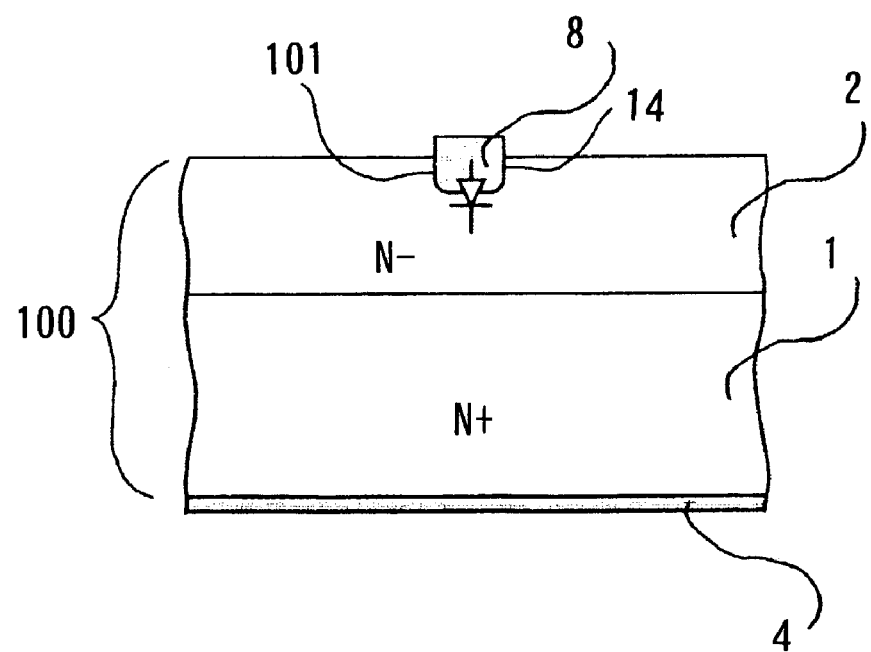
FIG. 5 is a cross sectional structural view of a semiconductor device in a third preferred embodiment according to the present invention.

The third preferred embodiment of the high reverse voltage silicon carbide diode according to the present invention will now be explained with reference to FIG. 5. FIG. 5 shows the cross sectional structure of this third preferred embodiment high reverse voltage silicon carbide diode. The explanation of structural portions thereof which are the same as corresponding structural portions of the high reverse voltage silicon carbide diode in the first preferred embodiment shown in FIG. 1 will be curtailed.

As shown in FIG. 5, an epitaxial layer 2 made of low concentration N type silicon carbide is formed upon a silicon carbide substrate 1 which consists of high concentration N type silicon carbide. Furthermore, a metal electrode 4 is formed on the rear surface side of the silicon carbide substrate 1. The structures of the silicon carbide substrate 1, the epitaxial layer 2, and the metal electrode 4 are the same as those employed for the corresponding portions of the high reverse voltage silicon carbide diode in the first preferred embodiment shown in FIG. 1.

The characteristic feature of the structure of this high reverse voltage silicon carbide diode according to the third preferred embodiment of the present invention is that a trench 14 is formed upon one portion of the surface of the epitaxial layer 2, and a polycrystalline silicon layer 8 is deposited so as to fill the interior of the trench 14. Although in the example shown in FIG. 5 a single trench has been formed in the epitaxial layer 2 and has been filled with the polycrystalline silicon, it would also be acceptable to form a plurality of such trenches, or not to fill the polycrystalline silicon into the entire volume of the trench, with a hetero junction being formed at one portion thereof, such as at its side wall portion or at its bottom portion.

Impurity may, for example, be introduced into the polycrystalline silicon layer 8. In this case, the explanation will be made in terms of the polycrystalline silicon layer 8 being one which is doped at low concentration with an N type impurity.

In other words, with this high reverse voltage silicon carbide diode in the third preferred embodiment according to the present invention, one or a plurality of trenches are provided upon one portion of a first main surface side of the first semiconductor base layer (the epitaxial layer 2), and a hetero junction 101 is formed on at least the bottom portion or a side wall portion of this trench or trenches.

With this high reverse voltage silicon carbide diode in the third preferred embodiment according to the present invention, since the junction 101 between the polycrystalline silicon layer 8 and the epitaxial layer 2 is formed so as to extend along the side wall of the trench 14, the diode is formed in the deep portion of the silicon carbide as well. In other words, in addition to the beneficial results which have been related above in connection with the first preferred embodiment of the present invention, it is also possible further to increase its range of applicability as an electronic component, since it is easily possible to increase the efficiency of the hetero junction area with good efficiency.

Figure 10A:
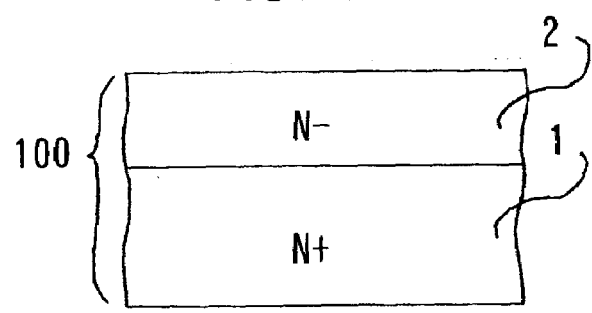
FIGS. 10A through 10F are cross sectional structural views showing a method of manufacture for the semiconductor device according to the third preferred embodiment of the present invention.

A method of manufacturing this high reverse voltage silicon carbide diode in the third preferred embodiment according to the present invention will now be explained with reference to FIGS. 10A~10F. As shown in FIG. 10A, a silicon carbide base layer 100 is prepared by forming a silicon carbide epitaxial layer 2 of an N type low concentration upon a silicon carbide substrate 1 of an N type high concentration. In FIG. 10B, a process is shown of making a trench 14 upon one portion of this epitaxial layer 2. During this process, it is acceptable, although not essential, to perform a surface cleaning.

Figure 10D:
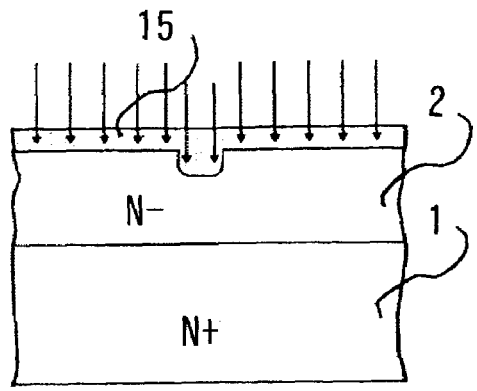
Figure 10B:
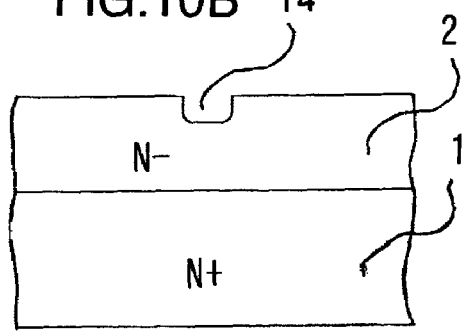
Figure 10E:
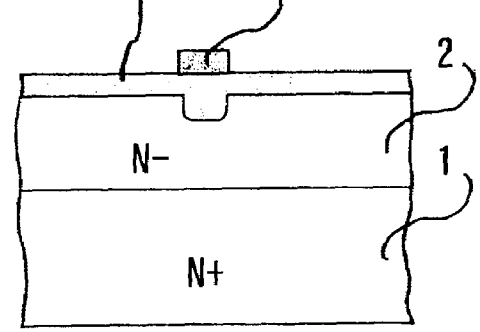
Figure 10C:
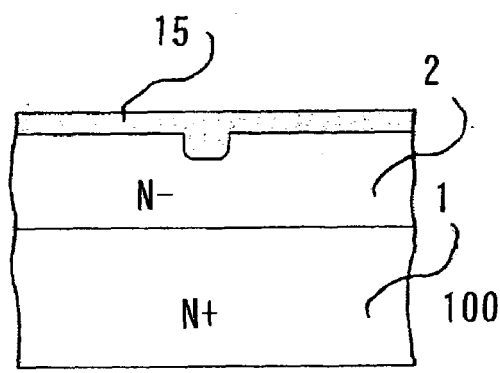

A process for depositing the polycrystalline silicon layer 15 is shown in FIG. 10C.

A process for introducing the desired impurity into the polycrystalline silicon layer 15 is shown in FIG. 10D. In this process the impurity is doped at high concentration; or, alternatively, the impurity may be also introduced into the polycrystalline silicon layer 15 by diffusion from a deposition layer which has been further deposited on the polycrystalline layer 15, by heat processing at approximately 900° C. to 1000° C. Furthermore, it would also be acceptable to introduce the impurity directly into the polycrystalline silicon layer 15 by ion implantation.

Figure 10F:
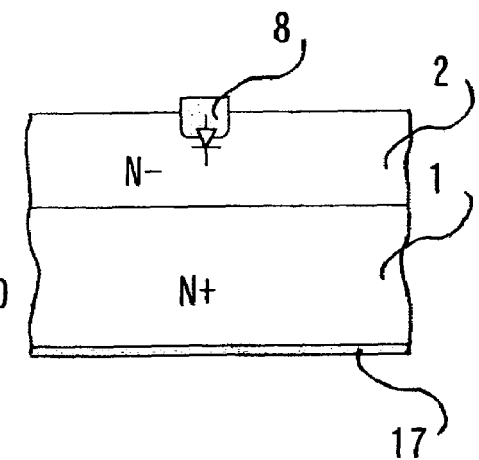

In FIG. 10E, there is shown a process of patterning a mask 16 upon the polycrystalline silicon layer 15. In FIG. 10F, there is shown a process of etching the portions of the polycrystalline silicon layer 15 which are not covered by the mask 16. Furthermore, in FIG. 10F, along with eliminating the mask 16 upon the polycrystalline silicon layer 15, a metal electrode 17 is formed upon the rear surface of the silicon carbide base layer 100. RTA (Rapid Thermal Annealing) is performed at a temperature of approximately 1000° C., according to requirements, so as to implement ohmic contact between the metal electrode 17 and the silicon carbide substrate 1.

It is to be noted that the method of manufacturing the high reverse voltage silicon carbide diode in the third preferred embodiment according to the present invention shown in FIGS. 10A through 10F comprises, before the process of cleaning the first main surface side of the first semiconductor base layer (the epitaxial layer 2), the performance of a process of forming a trench (the trench 14) upon a portion of the first main surface side of the first semiconductor base layer (the epitaxial layer 2), and, after the process of cleaning the main surface side of the first semiconductor base layer, the performance of a process of depositing a second semiconductor layer (the polycrystalline silicon layer 8) in the interior of the trench (the trench 14). According to this method of manufacturing this type of structure, it is possible to form a diode with the high reverse bias voltage capability following along the trench by a simple process.

It is to be noted that, with the methods of manufacturing the high reverse voltage silicon carbide diode of the first and the third preferred embodiments of the present invention, it is possible to add a process of heat processing at a temperature of 1300° C. or lower, after the process of depositing the polycrystalline silicon layer. With the process according to the first preferred embodiment which was explained with reference to FIG. 9C, this heat processing at a temperature of 1300° C. or lower corresponds to heat processing at a temperature of approximately 900° C. to 1000° C. in a process of introducing an impurity from a layer, into which an impurity has been doped at high concentration, which is deposited on the polycrystalline silicon layer 3, or corresponds to RTA at a temperature of approximately 1000° C. so as to bring the metal electrode 4 on the rear surface and the silicon carbide substrate 1 to achieve ohmic contact together. Furthermore, in relation to the process according to the third preferred embodiment which was explained with reference to FIG. 10D, it corresponds to heat processing at a temperature of approximately 900° C. to 1000° C. in a process of introducing an impurity from a layer, into which the impurity has been doped at high concentration, deposited on the polycrystalline silicon layer 15, or corresponds to RTA at a temperature of approximately 1000° C. so as to bring the metal electrode 17 on the rear surface and the silicon carbide substrate 1 to achieve ohmic contact together. In other words, heat processing at a temperature up to approximately 1300° C. becomes possible even after formation of the junction, so that it is possible to manufacture a diode whose range of application as an electronic component is wide.

If this method of manufacturing the high reverse voltage silicon carbide diode of the third preferred embodiment of the present invention is employed, the specific beneficial result is reaped that it is possible to manufacture the diode with the high reverse bias voltage capability by a simple manufacturing process.

In the above explanation of the high reverse voltage silicon carbide diode according to the first through the third preferred embodiments of the present invention, a diode with two terminals was explained in which the rear surface electrode constitutes the cathode while the polycrystalline silicon constitutes the anode. In order to fix the electrical potential of the polycrystalline silicon layer, it has been considered to form a further metal layer above the polycrystalline silicon layer to achieve an ohmic contact thereto. Although this concept has little influence upon the essence of the present invention, in concrete terms, it would be acceptable for it to be included in any of the preferred embodiments.

Figure 6:
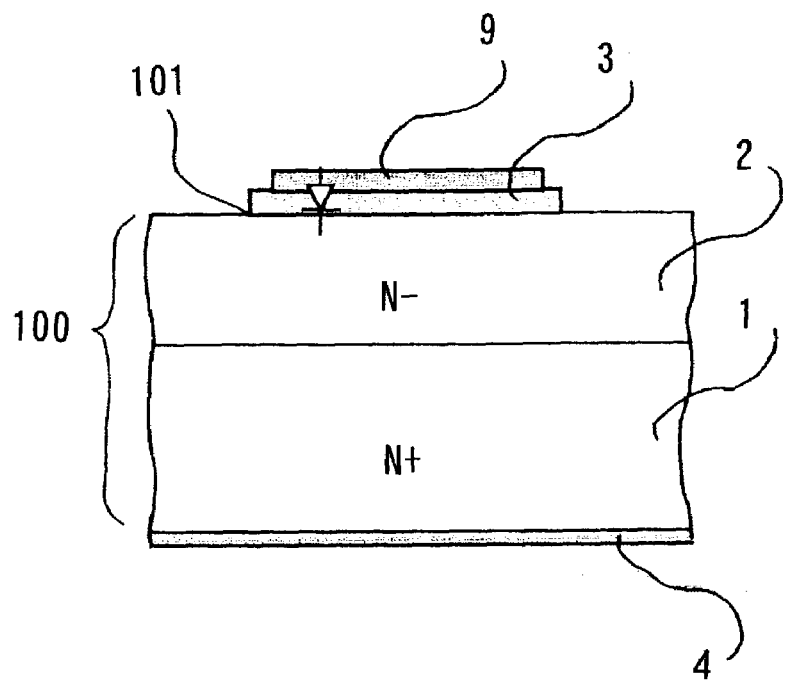
FIG. 6 is a cross sectional structural view showing a method of forming an electrode, which is common to various preferred embodiments of the present invention.

The structure of the diode shown in FIG. 6 is an example of this, in which a metal layer 9 is formed directly over the polycrystalline silicon layer 3. In this case, it is necessary for the polycrystalline silicon to be of the high concentration type, in order to achieve ohmic contact directly between the polycrystalline silicon layer 3 and the metal layer 9. Furthermore, it is necessary for the size of the metal layer 9 to be smaller than that of the polycrystalline silicon layer 3, in order for there to be no direct contact between the metal layer 9 and the silicon carbide.

Figure 7:
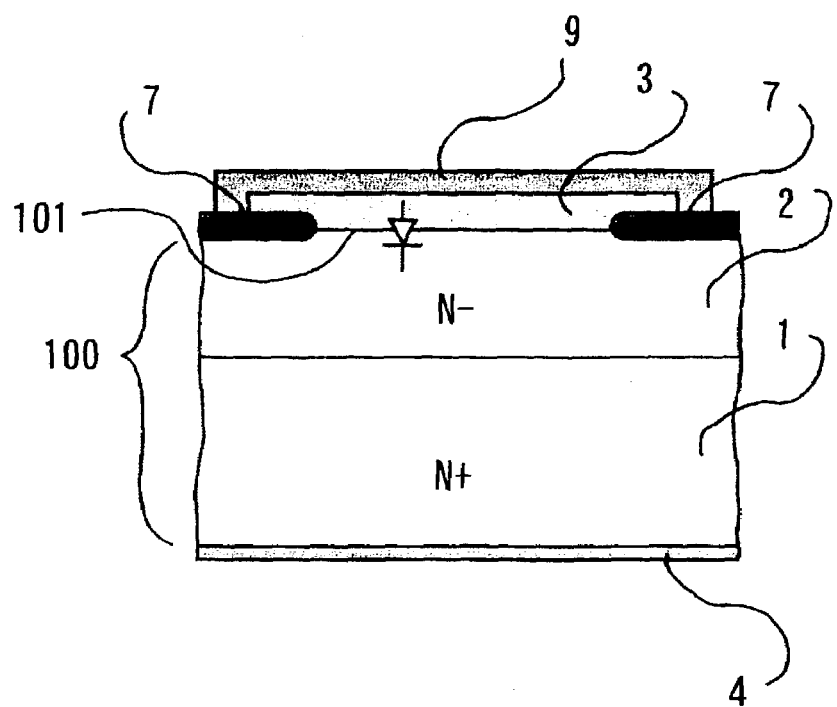
FIG. 7 is a cross sectional structural view showing a method of forming an electrode, which is common to various preferred embodiments of the present invention.

A diode structure like that shown in FIG. 7 has also been considered. With the diode shown in FIG. 7, the outermost peripheral portion of the polycrystalline silicon layer 3 is made so as to be carried upon an oxide film 7. In this type of structure, it is possible to make the size of the metal layer 9 to be greater than the size of the polycrystalline silicon layer 3, since there is not direct contact between the metal layer 9 and the silicon carbide.

Figure 8:
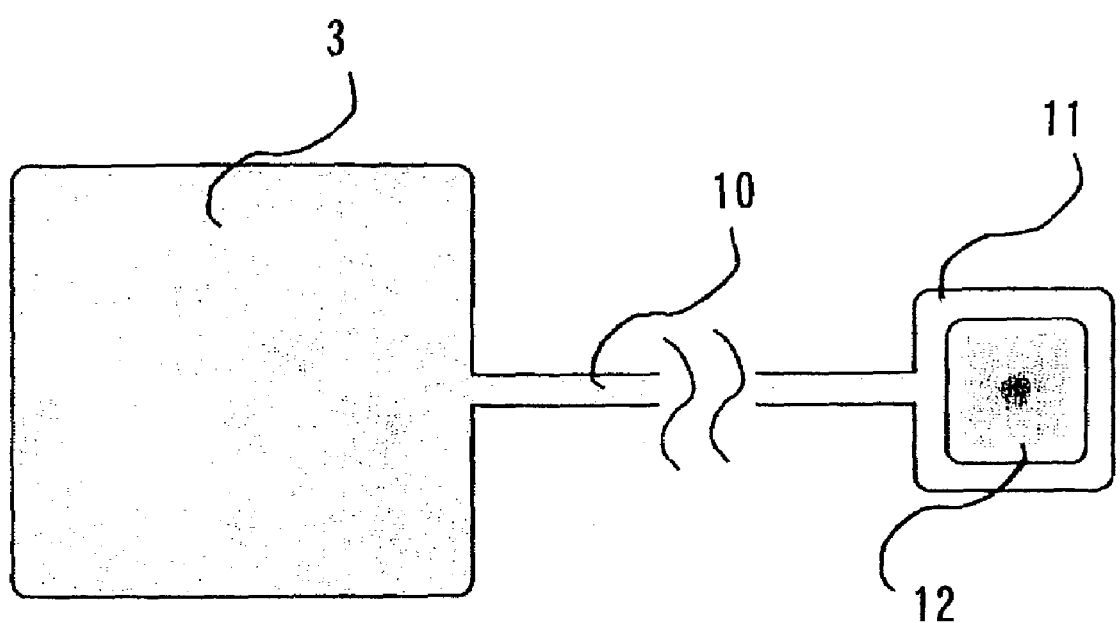
FIG. 8 is a layout plan view showing a method of forming an electrode, which is common to various preferred embodiments of the present invention.

Furthermore, a diode structure like that shown in FIG. 8 has also been considered. FIG. 8 is a plan view layout diagram for the diode as seen from its upper surface; the diode is formed directly under the rectangular polycrystalline silicon layer 3. Alternatively, the polycrystalline silicon layer 3 may not necessarily be rectangular. The polycrystalline silicon layer 3 is directly contacted with a pad region 11 by runner portions 10 of the polycrystalline silicon layer 3. A metal layer 12 is formed on top of the pad region 11. If the polycrystalline silicon layer of the pad region 11 is made to be of high concentration, then it is possible to implement an ohmic contact of low resistance between the metal layer 12 and the polycrystalline silicon layer 3. Due to this, in an actual device, the impurity concentration in the polycrystalline silicon layer 3 which is the diode portion can be determined freely at any desired concentration, since ohmic contact is achieved between the metal layer 12 and the polycrystalline silicon layer 3 at portions which are distant from the diode region. It is to be noted that, although in the diode structure shown in FIG. 8 the runner portion 10 is relatively thin, if for the function of the diode it is necessary for a large current to flow through it, it would be acceptable to make the runner portion 10 thick, or to achieve metal backings to the runner portion 10 with some different metal.

The Fourth Embodiment

Figure 16:
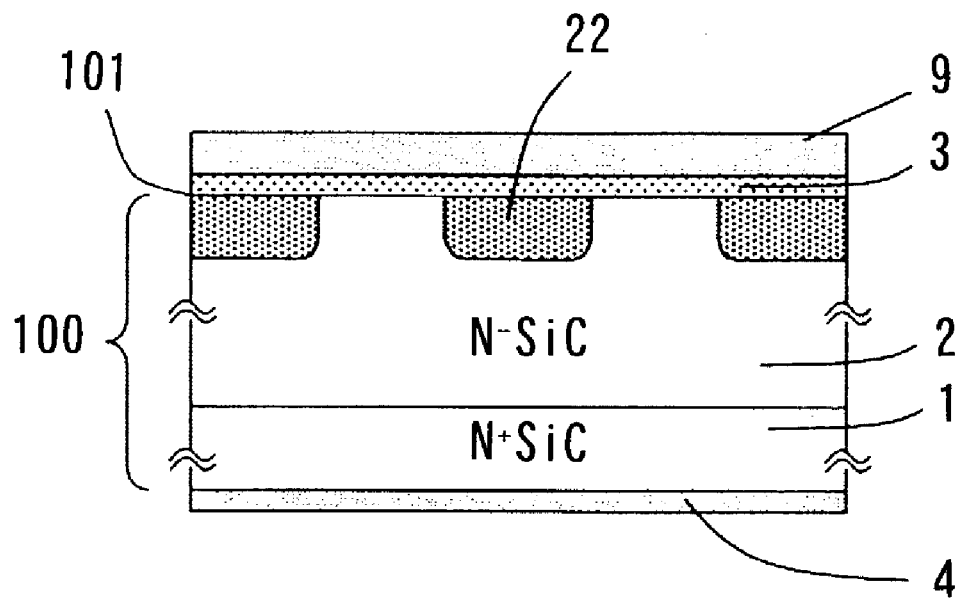
FIG. 16 is a cross sectional view of a semiconductor device which is a fourth preferred embodiment of the present invention.

FIG. 16 shows the structure of the fourth preferred embodiment of the high reverse voltage silicon carbide diode according to the present invention. FIG. 16 is a cross sectional view corresponding to the portion shown in FIG. 6, by way of example, in which an epitaxial layer 2 made of low concentration N type silicon carbide and a polyclystalline silicon layer 3 are contacted together, and moreover a first surface electrode 9 is formed over the polycrystalline silicon layer 3. The point in which this structure differs from that of FIG. 6, is that a plurality of electric field relaxation regions 22 which are made of, for example, P type silicon carbide are formed within the silicon carbide base layer 100, in the vicinity of the hetero junction 101 which is formed by the polycrystalline silicon layer 3. These electric field relaxation regions 22 which are made of P type silicon carbide are arranged at predetermined intervals in the vicinity of the polycrystalline silicon layer 3. In other words, the electric field relaxation regions 22 are provided so as to contact the first main surface of the low concentration N type silicon carbide epitaxial layer 2, and these electric field relaxation regions 22 are arranged around the periphery of the second semiconductor layer. Although in this fourth preferred embodiment of the present invention, by way of example, the case is shown in which these electric field relaxation regions 22 are made of P type silicon carbide, it would also be possible to obtain the beneficial effects explained below by providing similar regions made of a dielectric material such as oxide layer or the like.

It is to be noted that, if these electric field relaxation regions 22 are made of P type silicon carbide, they may be made by introducing a P type impurity into the low concentration N type silicon carbide epitaxial layer 2 by high energy ion implantation. Even in this case, there is no increase of the leakage current due to the introduction of this P type impurity. This is because, although defects in the silicon carbide are generated due to the high energy ion implantation, such defects are only generated in the portions other than the current path (the contacting portion between the polycrystalline silicon layer 3 and the low concentration N type silicon carbide epitaxial layer 2) through which current flows in the high reverse voltage silicon carbide diode which is formed.

The operation of this high reverse voltage silicon carbide diode in the fourth preferred embodiment according to the present invention will now be explained. When, for example, the first surface electrode 9 is brought to ground electrical potential, and a positive electrical potential is applied to the rear surface metal electrode 4, in other words when the diode is in the reverse bias state, in the low concentration N type silicon carbide epitaxial layer 2, along with the depletion layer being expanded from the interface of the hetero junction 101 with the polycrystalline silicon layer 3, also the depletion layer is expanded from the PN junction interface with the electric field relaxation regions 22 as well. At this time, if the distance between adjacent ones of the electric field relaxation regions 22 which face one another on opposite sides of the low concentration N type silicon carbide epitaxial layer 2 is small, the low concentration N type silicon carbide epitaxial layer 2 which contacts the polycrystalline silicon layer 3 is depleted, due to the depletion layers which extend from each of these electric field relaxation regions 22. In other words, in comparison to the diode according to the third preferred embodiment of the present invention which was shown in FIG. 6, since it is possible to moderate the electric field which is applied to the interface of the hetero junction 101 due to the depletion layers which extend from each of these electric field relaxation regions 22, therefore it is possible to reduce the leakage current in the reverse bias state, and it is possible further to enhance the voltage interception capability of the diode.

Figure 17:
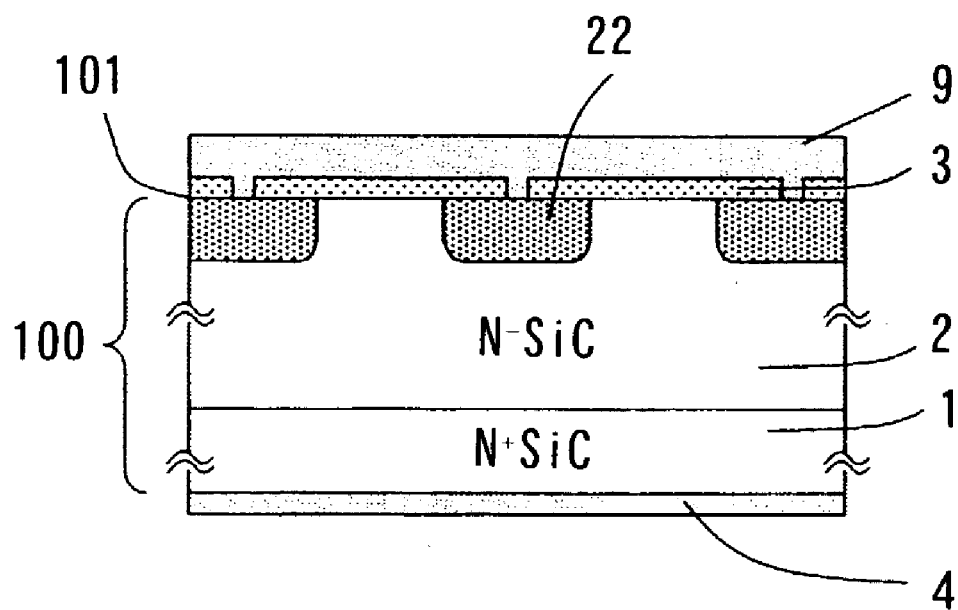
FIG. 17 is a cross sectional view of another semiconductor device according to this fourth preferred embodiment of the present invention, which has a variant structure.

In FIG. 16, the example was shown of the electric field relaxation regions 22 being contacted with the polycrystalline silicon layer 3 over their whole surfaces at the interface of the hetero junction 101. However if, as shown in FIG. 17 for example, portions of the electric field relaxation regions 22 are contacted with the first surface electrode, then, since the electrical potential of the electric field relaxation regions 22 is almost fixed to the electrical potential of the first surface electrode 9, accordingly the electric field relaxation beneficial results are exhibited more stably. Furthermore although, with the diode structure which was shown by way of example in FIGS. 16 and 17, the case was shown in which the polycrystalline silicon layer 3 is contacted with the electric field relaxation regions 22, it would be possible to obtain the same beneficial results as described above, even if the polycrystalline silicon layer 3 is not contacted with the electric field relaxation regions 22.

The Fifth Preferred Embodiment

Figure 18:
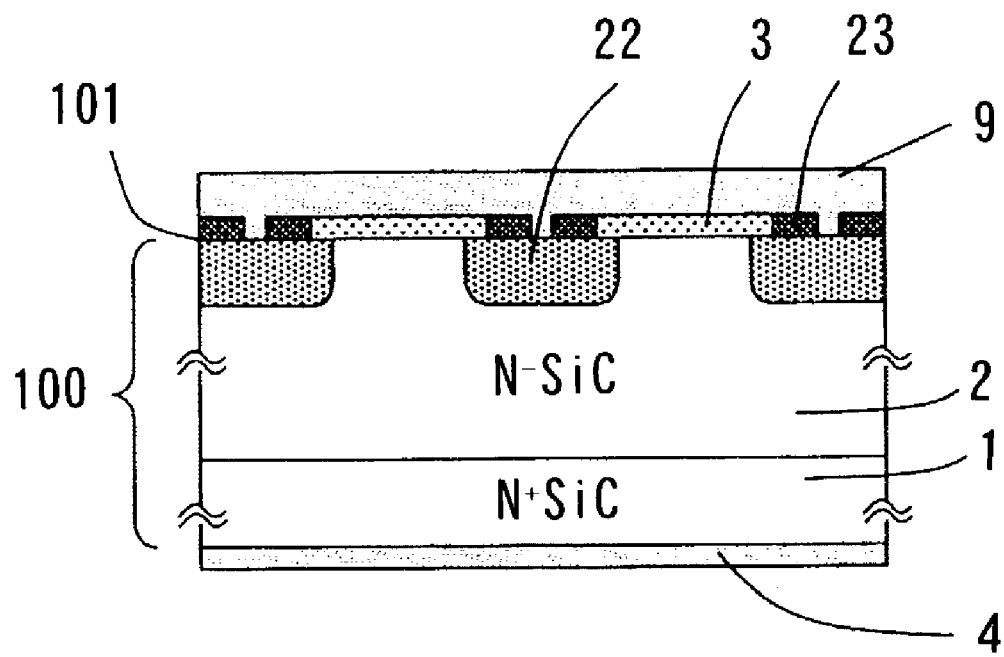
FIG. 18 is a cross sectional view of a semiconductor device which is a fifth preferred embodiment of the present invention.

FIG. 18 is a figure showing the structure of the fifth preferred embodiment of the high reverse voltage silicon carbide diode according to the present invention, and is a cross sectional view corresponding to the portion shown in FIG. 17, by way of example. The point in which this structure differs from that of FIG. 17, is that a high concentration polycrystalline silicon layer 23, which is contacted with the polycrystalline silicon layer 3 and the first surface electrode 9, is formed to contact with the electric field relaxation regions 22 but not to contact with the low concentration N type silicon carbide epitaxial layer 2. The impurity concentration in this high concentration polycrystalline silicon layer 23 is higher than in the polycrystalline silicon layer 3, and it is formed to achieve ohmic contact with the first surface electrode 9. In other words, the electric field relaxation regions 22 are contacted with the second semiconductor layer, and moreover the impurity concentration in those portions of the second semiconductor layer which are contacted with the electric field relaxation regions 22 is relatively high as compared with the other portions thereof.

The operation of this high reverse voltage silicon carbide diode in the fifth preferred embodiment according to the present invention will now be explained. When, for example, the first surface electrode 9 is brought to ground electrical potential, and a positive electrical potential is applied to the rear surface metal electrode 4, in other words when the diode is in the reverse bias state, in the low concentration N type silicon carbide epitaxial layer 2, along with the depletion layer being expanded from the interface of the hetero junction 101 with the polycrystalline silicon layer 3, also the depletion layer is expanded from the PN junction interface with the electric field relaxation regions 22 as well. No electric field comes to be directly applied to the high concentration polycrystalline silicon layer 23 during reverse bias, since the high concentration polycrystalline silicon layer 23 is formed so as not to contact with the silicon carbide epitaxial layer 2. In other words, in the same manner as shown by way of example in the cases of the first through the fourth preferred embodiments of the present invention described above, ohmic contact is achieved between the first surface electrode 9 and the polycrystalline, while the high reverse bias voltage capability of the hetero junction 101 is maintained just as it is. Due to this, it is possible to reduce the resistance when conducting current in the forward direction easily at a manufacturing process, by varying the type of the impurity or the impurity concentration in areas.

The Sixth Preferred Embodiment

Figure 19:
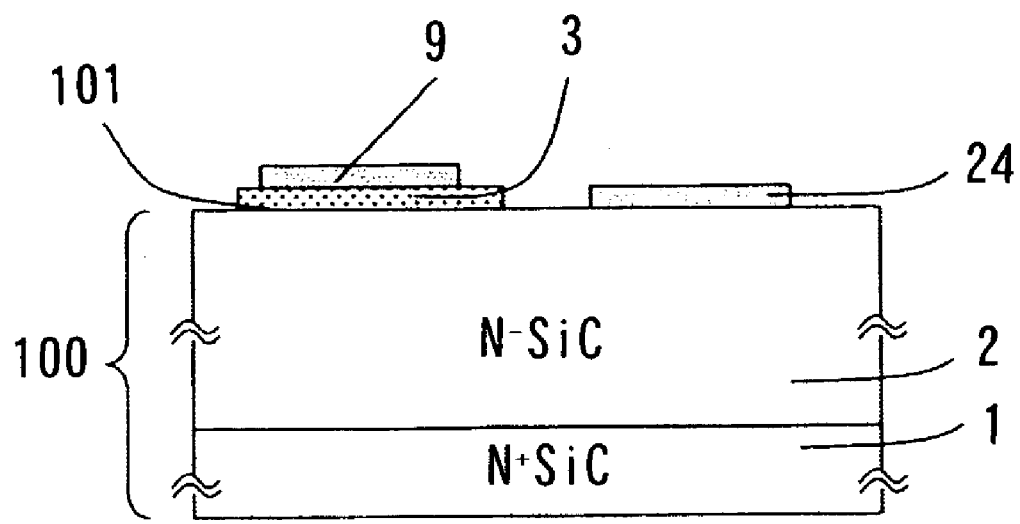
FIG. 19 is a cross sectional view of a semiconductor device which is a sixth preferred embodiment of the present invention.

FIG. 19 is a figure showing the structure of the sixth preferred embodiment of the high reverse voltage silicon carbide diode according to the present invention, and is a cross sectional view corresponding to the structure shown in FIG. 1, by way of example. The point in which this structure differs from that shown in FIG. 1, is that a second surface electrode 24 is formed so as to contact with the epitaxial layer 2 but not to contact with the polycrystalline silicon layer 3; and the case is shown of a lateral type diode in which the polycrystalline silicon layer 3 is taken as the anode, while the second surface electrode 24 is taken as the cathode. In other words, on the first main surface side of the first semiconductor base layer there is comprised a junction with the second semiconductor layer, and furthermore the metal electrode is formed on the first main surface side of the first semiconductor base layer, being not to contact with the second semiconductor layer.

The operation of this high reverse voltage silicon carbide diode according to the sixth preferred embodiment of the present invention is the same as that in the vertical type diode of the first preferred embodiment. That is to say, when the second surface electrode 24 is taken as a cathode, and the polycrystalline silicon layer 3 is taken as an anode, and a voltage is applied between the two of them, a rectifying action occurs at the interface of the hetero junction 101 between the polycrystalline silicon layer 3 and the silicon carbide epitaxial layer 2, so that the diode characteristics are obtained. In other words, even with a lateral type diode structure, it is possible to form a diode of the structure shown by way of example in the first through the fifth preferred embodiments of the present invention, and it is possible to obtain the same operation as in those previous cases, and the same beneficial results. Furthermore, by adopting a structure like that of a lateral type diode for this sixth preferred embodiment of the present invention, it becomes possible to form a plurality of polycrystalline silicon layers 3 upon the same substrate while varying the types of the impurity and/or the impurity concentration, i.e. to form upon the same substrate a plurality of structures suitably matched to the structures of other devices, in other words to further intelligentize its application, and accordingly it is possible to widen the range of application of this diode as an electronic component.

The Seventh Preferred Embodiment

Figure 21:
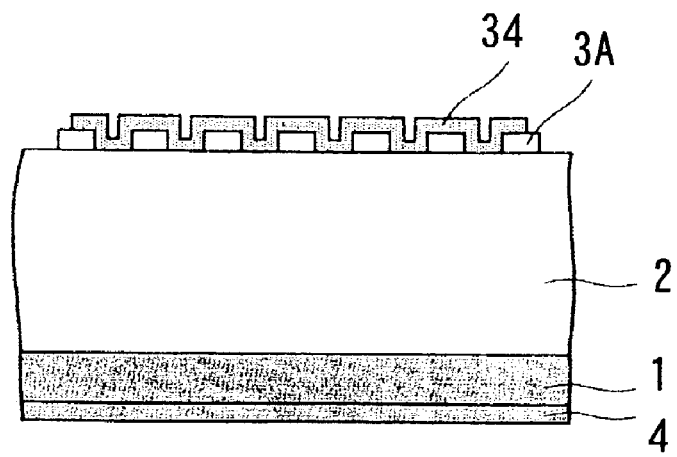
FIG. 21 is a cross sectional view of a semiconductor device which is a seventh preferred embodiment of the present invention.

Along with comprising a hetero junction between a silicon carbide base layer and a polycrystalline silicon layer, a high reverse voltage silicon carbide diode according to the seventh preferred embodiment of the present invention is provided with a Schottky electrode which is made of metal, upon exposed portions of a first main surface of a silicon carbide base layer and a first main surface of the polycrystalline silicon layer. FIG. 21 is a cross sectional view showing a high reverse voltage silicon carbide diode in this seventh preferred embodiment according to the present invention.

As shown in FIG. 21, an N type low concentration silicon carbide epitaxial layer 2 is formed upon an N type high concentration silicon carbide substrate 1. Furthermore, a metal electrode 4 is formed on the rear surface side of the silicon carbide substrate 1. The structures of the silicon carbide substrate 1, the epitaxial layer 2 and the metal electrode 4 are the same as those employed for the corresponding portions of the high reverse voltage silicon carbide diode in the first preferred embodiment shown in FIG. 1. Polycrystalline silicon layers 3A are formed at one or a plurality of places on the first main surface of the epitaxial layer 2, and a Schottky electrode 34 which is made of metal is formed to cover the first main surfaces of the silicon carbide epitaxial layer 2, where it is exposed, and of the polycrystalline silicon layer 3A. In this way, with the high reverse voltage silicon carbide diode according to the seventh preferred embodiment of the present invention, a vertical diode is constituted, with the Schottky electrode 34 serving as the anode and the metal electrode 4 serving as the cathode.

In other words, this high reverse voltage silicon carbide diode in this seventh preferred embodiment according to the present invention comprises a silicon carbide epitaxial layer 2 which is provided upon the first main surface of a silicon carbide substrate 1, a Schottky electrode 34 which is made of metal and which is provided upon the first main surface of the silicon carbide epitaxial layer 2, and a metal electrode 4 which is formed so as to contact with the silicon carbide substrate 1. Furthermore, a polycrystalline silicon layer 3A is provided at one or a plurality of places upon the first main surface of the silicon carbide epitaxial layer 2, and a Schottky electrode 34 is formed to cover the first main surfaces of the silicon carbide epitaxial layer 2, where it is exposed, and of the polycrystalline silicon layer 3A.

According to this structure, when voltage is applied in the reverse direction, a depletion layer extends from the hetero junction at the Schottky junction interface between the epitaxial layer 2 and the Schottky electrode 34, and the strength of the electric field at this Schottky junction interface is moderated, so that it is possible to reduce the leakage current when voltage is applied in the reverse direction. In the same manner as with the high reverse voltage silicon carbide diodes described above according to the first through the sixth preferred embodiments of the present invention, there is no occurrence of the problem of roughening the epitaxial layer surface due to the generation of lattice defect caused by ion implantation, or due to heat processing, since it is possible to manufacture this component without the use of such ion implantation.

It is to be noted that the provision of the polycrystalline silicon layer 3A at one or a plurality of places upon the first main surface of the silicon carbide epitaxial layer 2 is so as to cause a depletion layer to be extended from the hetero junction when voltage is applied in the reverse direction, in order to moderate the electric field intensity at the Schottky junction interface between the epitaxial layer 2 and the Schottky electrode 34, and in order thus effectively to reduce the leakage current.

Figure 22:
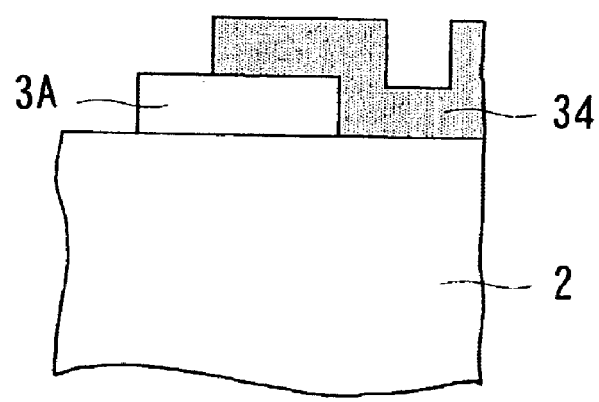
FIG. 22 is a magnified cross sectional view of an essential portion of the semiconductor device shown in FIG. 21.

FIG. 22 is an enlarged view showing an essential portion shown in FIG. 21 (one of the polycrystalline silicon layer 3A and the Schottky electrode 34 which is formed upon it). As shown in FIG. 22, the outermost peripheral portion of the Schottky electrode 34 is terminated on top of the polycrystalline silicon layer 3A.

With a prior art type diode incorporating a PN junction diode or a Schottky junction diode, it is easy for the electric field to be concentrated at the outermost periphery of the active region, and this can easily be a cause of reduction of the reverse bias voltage capability or of increase of the leakage current. However, with this high reverse voltage silicon carbide diode according to the seventh preferred embodiment of the present invention, the breakdown voltage around the outer peripheral portion of the Schottky junction is high, since there is the hetero junction which has a high reverse bias voltage characteristics as shown in FIG. 22 around the outer peripheral portion of the Schottky junction. To put it in another way, even if a voltage is applied to the diode in the reverse direction, and the electric field at the hetero junction interface at the outermost peripheral portion of the diode becomes remarkably high, nevertheless increase of the reverse bias leakage current at the peripheral portion is suppressed, since the breakdown voltage of the hetero junction which is formed at the outer peripheral portion of the Schottky junction is high.

Accordingly, the hetero junction between the polycrystalline silicon and the silicon carbide functions as the edge termination. In other words, there are the beneficial results that a diode with the high reverse bias voltage capability can easily be produced, and that it becomes possible to simplify the manufacturing process therefor, since it is not necessary to perform any special edge termination technique at the outer peripheral portion with a PN junction or the like which needs to be formed within the silicon carbide.

Method of Manufacture of the High Reverse Voltage Silicon Carbide Diode According to the Seventh Preferred Embodiment Next, a manufacturing process according to the present invention for this a high reverse voltage silicon carbide diode will be explained with reference to FIGS. 23A through 23E.

Figure 23A:
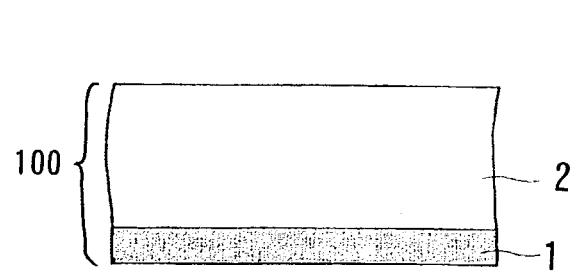
FIGS. 23A through 23E are cross sectional process views showing a method of manufacture of the semiconductor device according to the seventh preferred embodiment of the present invention.

As shown in FIG. 23A, an N type silicon carbide base layer 100 is prepared by forming an N type low concentration silicon carbide epitaxial layer 2 upon a first main surface of an N type high concentration silicon carbide substrate 1.

Figure 23B:
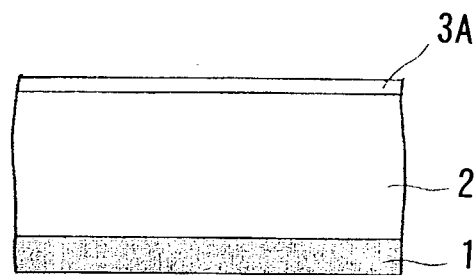

Next, as shown in FIG. 23B, after depositing the polycrystalline silicon layer 3A upon this epitaxial layer 2, the desired impurity is introduced into this polycrystalline silicon layer 3A. In this process of introducing the impurity into this polycrystalline silicon layer 3A, a solid phase diffusion method is available. In the solid phase diffusion method, a deposition layer doped at high impurity concentration is formed on the polycrystalline silicon layer 3A and the impurity is introduced into the polycrystalline silicon layer 3A by diffusion from the deposition layer as a source of diffusion. Furthermore, it would also be acceptable to introduce the impurity through a screen film into the polycrystalline silicon layer 3A by ion implantation method. Yet further, it would also be possible to introduce the impurity from the vapor phase. In this case, it is possible to utilize a per se conventional vapor phase diffusion method. In concrete terms, the impurity is introduced in a diffusion furnace as a gas along with a carrier gas. The proportion of the gas may be accurately controlled by a gas-mixing device which is equipped with a mass flow controller. For the carrier gas, generally an inert-gas such as argon or the like is employed. After this, heat processing is performed in a nitrogen atmosphere for about one minute at a temperature of about 1000° C., and the structure of the hitero junction interface is elaborated.

Figure 23C:
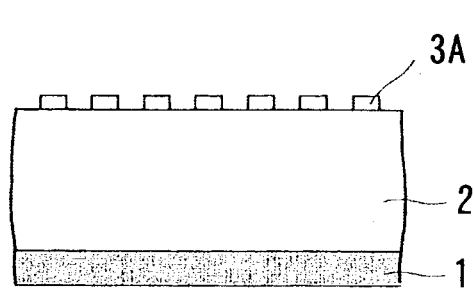

Next, the polycrystalline silicon layer 3A is patterned by photolithography and by etching, so that, as shown in FIG. 23C, it is formed into stripes which are spaced apart at predetermined intervals.

Figure 23D:
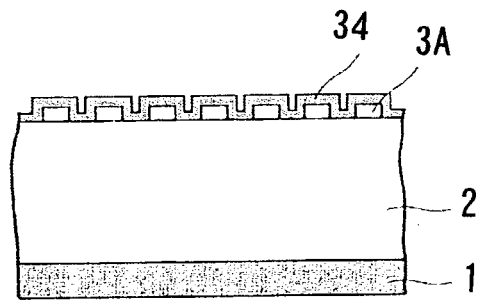

Next, as shown in FIG. 23D, a layer of titanium is deposited by a spattering method over the tops of the portions of the epitaxial layer 2 which remain exposed, and over the tops of the stripes of the polycrystalline silicon layer 3A.

Figure 23E:
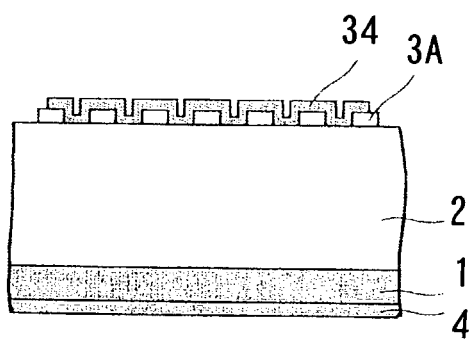

Next, as shown in FIG. 23E, the titanium layer is patterned by photolithography and by etching so that the periphery of the Schottky electrode 34 is terminated at the polycrystalline silicon layer 3A. After this, a titanium layer and an aluminum layer are formed in order by a spattering method upon the rear surface of the silicon carbide substrate 1, so as to serve as the metal electrode 4, and thereby the high reverse voltage silicon carbide diode is produced.

In other words, the method of manufacturing the high reverse voltage silicon carbide diode in the seventh preferred embodiment according to the present invention shown in FIGS. 23A through 23E comprises the following processes: a process of forming the epitaxial layer 2 on the first main surface of the silicon carbide substrate 1; a process of forming the polycrystalline silicon layer 3A in one or in a plurality of places upon the first main surface of the epitaxial layer 2; a process of doping impurity into the polycrystalline silicon layer 3A; a process of forming the Schottky electrode 34 which is made of metal over the first main surfaces of the epitaxial layer 2, where it is exposed, and of the polycrystalline silicon layer 3A; and a process of forming the metal electrode 4 so as to contact the silicon carbide substrate 1.

In the high reverse voltage silicon carbide diode which is produced in this manner, when voltage is applied in the reverse direction, a depletion layer extends from the hetero junction between the polycrystalline silicon and the silicon carbide and the strength of the electric field at this Schottky junction interface is moderated, so that it is possible to reduce the leakage current when voltage is applied in the reverse direction. Moreover, since the hetero junction whose reverse bias voltage capability is high is provided at the peripheral portion of the Schottky electrode 34 at which the electric field is easy to be concentrated, the breakdown voltage is high at the outer peripheral portion of the Schottky junction and the leakage current is reduced.

The above described method of manufacture comprises, between the process of forming the polycrystalline silicon layer 3A and the process of forming the Schottky electrode 34 which is made of metal, a process of performing heat processing at a temperature equal to or less than 1300° C. (the above described heat processing in a nitrogen atmosphere for about one minute at a temperature of 1000° C.).

If heat processing is performed at a temperature of 1300° C. or less after depositing the polycrystalline silicon layer in this manner and moreover before forming the Schottky electrode, then it is possible to form the hetero junction in a more satisfactory manner, by further elaborating the polycrystalline silicon/silicon carbide epitaxial layer interface structure. Furthermore, since the heat processing is performed before forming the Schottky electrode, it is possible to prevent the occurrence of any reaction between the metal and the silicon carbide (silicidation or carbidation).

The Eighth Preferred Embodiment

Figure 24:
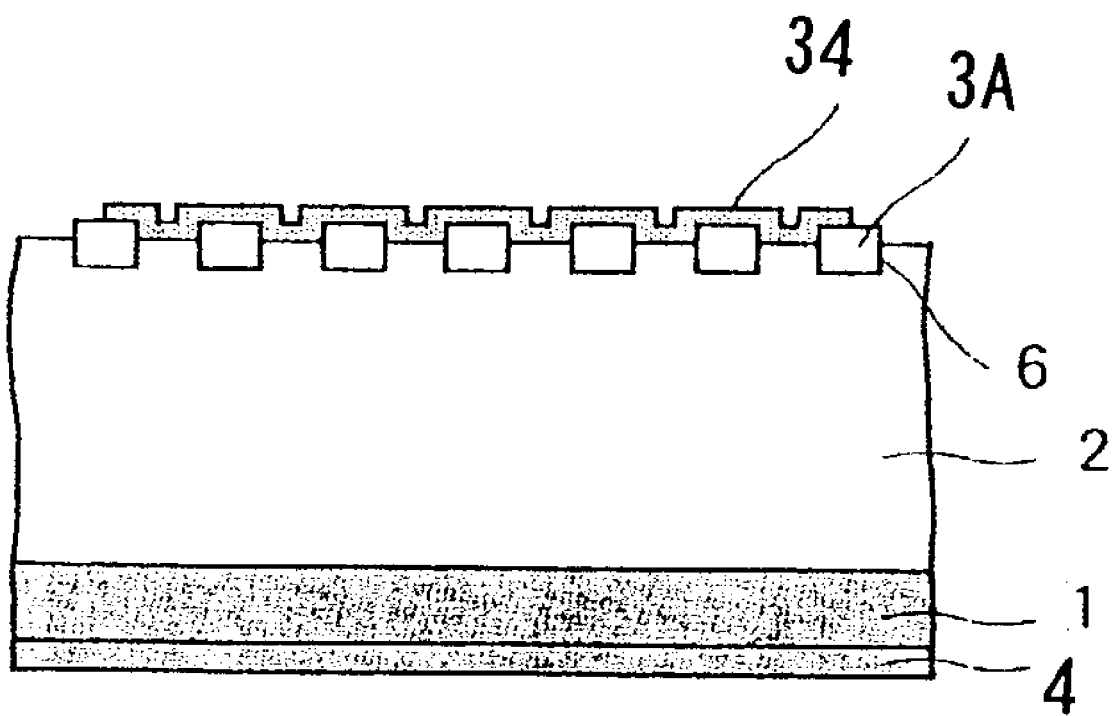
FIG. 24 is a cross sectional view of a semiconductor device which is an eighth preferred embodiment of the present invention.

The diode in the eighth preferred embodiment according to the present invention is a high reverse voltage silicon carbide diode, just like the diode according to the seventh preferred embodiment. FIG. 24 is a cross sectional view showing a high reverse voltage silicon carbide diode in this eighth preferred embodiment.

An N type low concentration silicon carbide epitaxial layer 2 is formed upon a first main surface of an N type high concentration silicon carbide substrate 1. Trenches 36 are formed at predetermined intervals upon the first main surface of the epitaxial layer 2. Polycrystalline silicon layers 3A are laid into the interiors of the trenches 36. A Schottky electrode 34 which is made of metal is formed over the first main surfaces of the epitaxial layer 2, where it is exposed, and the polycrystalline silicon layers 3A. A metal electrode 4 is formed upon the rear surface of the silicon carbide substrate 1.

In other words, this high reverse voltage silicon carbide diode in this eighth preferred embodiment according to the present invention comprises an epitaxial layer 2 which is provided upon the first main surface of a silicon carbide substrate 1, a Schottky electrode 34 which is made of metal and which is provided upon the first main surface of the silicon carbide epitaxial layer 2, and a metal electrode 4 which is formed so as to contact the silicon carbide substrate 1. Furthermore, one or more trenches 36 are provided at one or a plurality of places upon the first main surface of the epitaxial layer 2, polycrystalline silicon layers 3A are laid into the interior of these trenches 36, and a Schottky electrode 34 is arranged to cover the first main surfaces of the epitaxial layer 2, where it is exposed, and of the polycrystalline silicon layers 3A.

Since, in this manner, the trenches 36 are formed at predetermined intervals in the epitaxial layer 2, and the hetero junction is formed inside the trenches 36, therefore this the hetero junction comes to be well embedded in the epitaxial layer 2. Accordingly, it is possible to cause a depletion layer to be extended from the hetero junction interface to the Schottky junction interface efficiently when voltage is applied in the reverse direction. Thus, it is possible to moderate the electric field intensity at the Schottky junction interface effectively and to reduce the leakage current.

Method of Manufacture of the High Reverse Voltage Silicon Carbide Diode According to the Eighth Preferred Embodiment Next, a manufacturing process according to the present invention for this high reverse voltage silicon carbide diode will be explained with reference to FIGS. 25A through 25G.

Figure 25A:
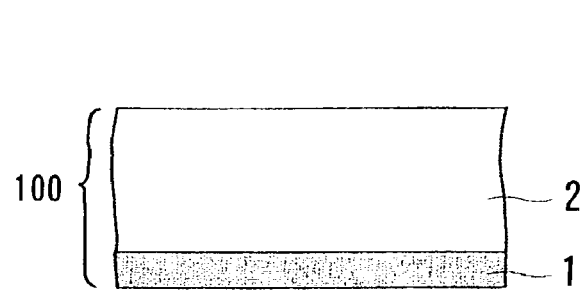
FIGS. 25A through 25G are cross sectional process views showing a method of manufacture of the semiconductor device according to the eighth preferred embodiment of the present invention.

First, as shown in FIG. 25A, an N type silicon carbide base layer 100 is prepared by forming an N type low concentration silicon carbide epitaxial layer 2 upon a first main surface of an N type high concentration silicon carbide substrate 1.

Figure 25B:
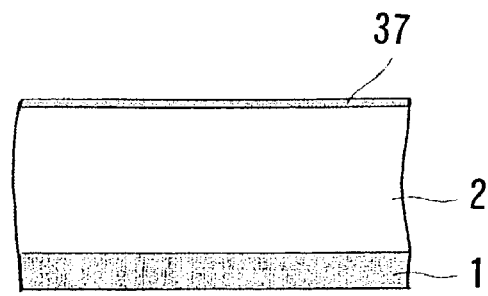

Next, as shown in FIG. 25B, an oxide film 37 is deposited on the epitaxial layer 2 by a CVD method. After this, the oxide layer 37 is patterned by photolithography and by etching.

Figure 25C:
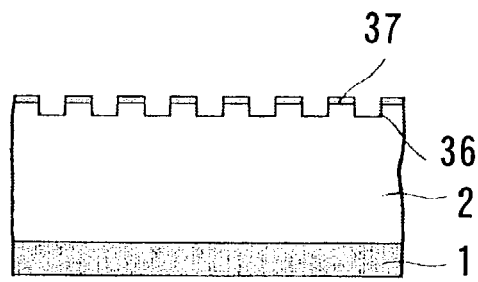

Next, the epitaxial layer 2 is etched using this oxide film 37 as a mask, and, as shown in FIG. 25C, at least 2 of the trenches 36 are formed at predetermined intervals.

Figure 25D:
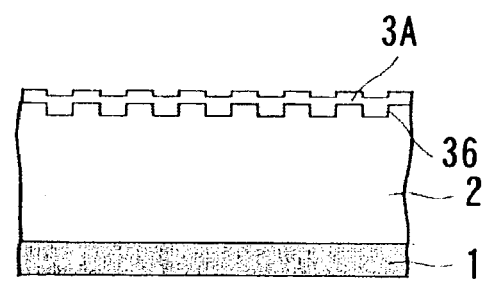

Next, as shown in FIG. 25D, after depositing the polycrystalline silicon layer 3A upon this epitaxial layer 2 and all the trenches 36, the desired impurity is introduced into this polycrystalline silicon layer 3A. In this process of introducing the impurity into this polycrystalline silicon layer 3A, a solid phase diffusion method is available. In the solid phase diffusion method, a deposition layer doped at high impurity concentration is formed on the polycrystalline silicon layer 3A and the impurity is introduced into the polycrystalline silicon layer 3A by diffusion from the deposition layer as a source of diffusion. Furthermore, it would also be acceptable to introduce the impurity through a screen film into the polycrystalline silicon layer 3A by ion implantation method. Yet further, it would also be possible to introduce the impurity from the vapor phase. In this case, it is possible to utilize a per se conventional vapor phase diffusion method. In concrete terms, the impurity is introduced in a diffusion furnace as a gas along with a carrier gas. The proportion of the gas may be accurately controlled by a gas-mixing device which is equipped with a mass flow controller. For the carrier gas, generally an inert-gas such as argon or the like is employed. After this, heat processing is performed in a nitrogen atmosphere for about one minute at a temperature of about 1000° C., and the structure of the hetero junction interface is elaborated.

Figure 25E:
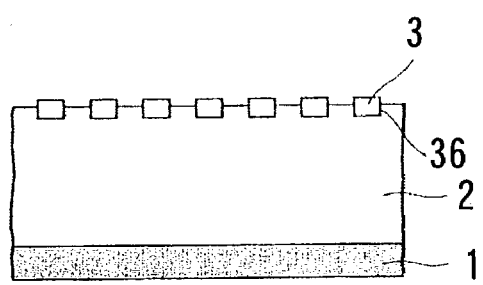

Next, the polycrystalline silicon layer 3A is patterned by photolithography and by etching, and, as shown in FIG. 25E, a structure is formed in which only the stripe shaped portions of the polycrystalline silicon layer 3A which are embedded into the interiors of the trenches 36 remain, spaced apart at predetermined intervals.

Figure 25F:
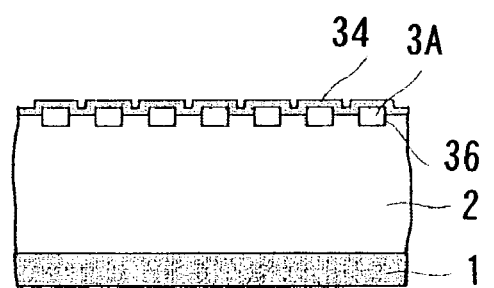

Next, as shown in FIG. 25F, a layer of titanium is deposited by a spattering method over the tops of the portions of the epitaxial layer 2 which remain exposed, and over the tops of the stripes of the polycrystalline silicon layer 3A.

Figure 25G:
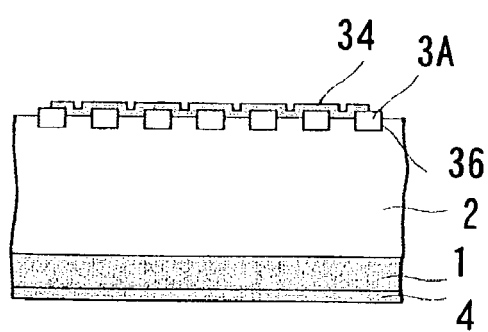

Finally, as shown in FIG. 25G, the titanium layer is patterned by photolithography and by etching so that the periphery of the Schottky electrode 34 is terminated at the polycrystalline silicon layer 3A. After this, a titanium layer and an aluminum layer are formed in order by a spattering method upon the rear surface of the silicon carbide substrate 1, so as to serve as the metal electrode 4, and thereby the high reverse voltage silicon carbide diode is produced.

In other words, the method of manufacturing the high reverse voltage silicon carbide diode in the eighth preferred embodiment according to the present invention shown in FIGS. 25A through 25G comprises the following processes: a process of forming the epitaxial layer 2 on the first main surface of the silicon carbide substrate 1; a process of forming one or more trenches 36 at one or a plurality of places upon the first main surface of the epitaxial layer 2; a process of forming the polycrystalline silicon layer 3A in the interiors of the trenches 36; a process of doping impurity into the polycrystalline silicon layer 3A; a process of forming the Schottky electrode 34 which is made of metal over the first main surfaces of the epitaxial layer 2, where it is exposed, and of the polycrystalline silicon layer 3A; and a process of forming the metal electrode 4 so as to contact with the silicon carbide substrate 1.

Since, in the high reverse voltage silicon carbide diode which is produced in this manner, the trenches 36 are formed in the epitaxial layer 2 at predetermined intervals, and the hetero junction is formed inside the trenches 36, therefore this the hetero junction comes to be well embedded in the epitaxial layer 2. Accordingly, it is possible to cause a depletion layer to be extended from the hetero junction interface to the Schottky junction interface efficiently when voltage is applied in the reverse direction. Thus, it is possible to moderate the electric field intensity at the Schottky junction interface effectively and to reduce the leakage current.

The Ninth Preferred Embodiment

Figure 26:
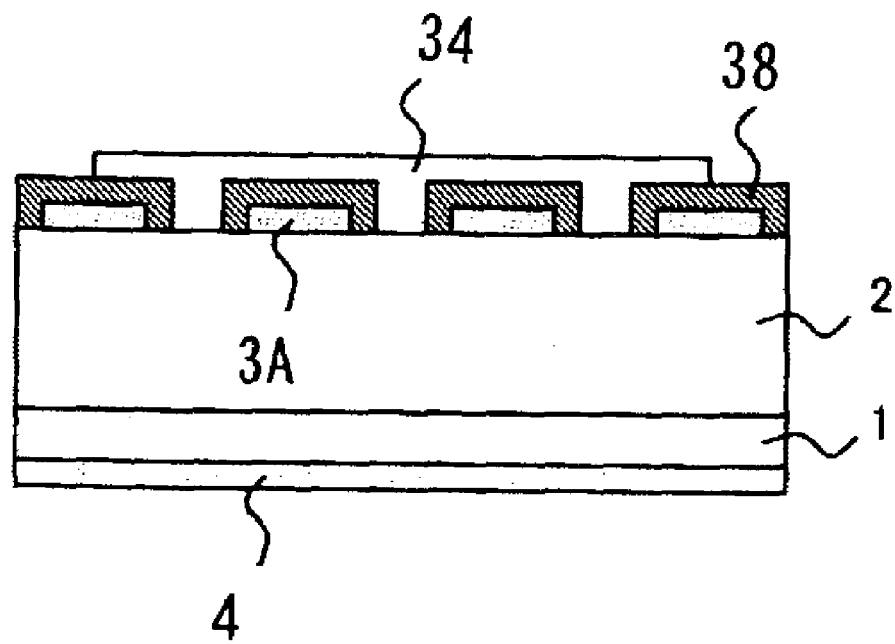
FIG. 26 is a cross sectional view of a semiconductor device which is a ninth preferred embodiment of the present invention.

The diode according to the ninth preferred embodiment of the present invention is a high reverse voltage silicon carbide diode, just like the diodes according to the seventh and eighth preferred embodiments. FIG. 26 is a cross sectional view showing a high reverse voltage silicon carbide diode according to this ninth preferred embodiment.

A silicon carbide epitaxial layer 2 is superimposed upon the first main surface of a silicon carbide substrate 1, with the impurity concentration in this epitaxial layer 2 being lower than the impurity concentration in the silicon carbide substrate 1. Polycrystalline silicon layers 3A are formed at predetermined intervals on a first main surface of the epitaxial layer 2. An oxide film 38 is covered over the surface of the polycrystalline silicon layer 3A. A Schottky electrode 34 made of metal is formed so as to contact with the upper surface of the epitaxial layer 2, where it is exposed, while being insulated from the polycrystalline silicon layer 3A by the oxide film 38. A metal electrode 4 is formed upon the rear surface of the silicon carbide substrate 1. In other words, at least one or more stripes of the polycrystalline silicon layer 3A are formed upon the first main surface of the epitaxial layer 2 at one or a plurality of places, and these stripes are insulated from the Schottky electrode 34 by, for example, the oxide film 38.

Figure 27:
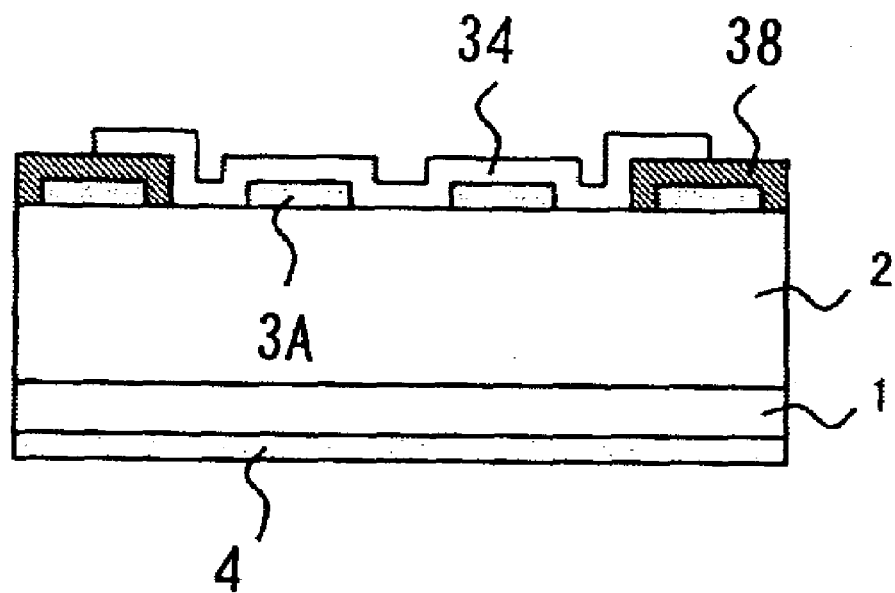
FIG. 27 is a cross sectional view of a semiconductor device according to the ninth preferred embodiment of the present invention, which has a variant structure.

With this structure shown in FIG. 26, the Schottky electrode 34 and the polycrystalline silicon layer 3A are completely insulated from one another by the oxide layer 38, but it would also be possible, as an alternative, as shown in FIG. 27, to form the oxide layer 38 over only a portion of the polycrystalline silicon layer 3A, and only to insulate this portion of the polycrystalline silicon layer 3A from the Schottky electrode 34.

According to this structure shown in FIG. 27, since the stripes of the polycrystalline silicon layer 3A are arranged at predetermined intervals, when a voltage is applied in the reverse direction, the strength of the electric field at the Schottky junction interface between the Schottky electrode 34 and the epitaxial layer 2 is moderated, so that, in addition to being possible effectively to reduce the leakage current, since the Schottky electrode 34 and the polycrystalline silicon layer 3A are insulated from one another by the insulating layer such as the oxide film 38 or the like, it is possible to prevent leakage current between the Schottky electrode 34 and the polycrystalline silicon layer 3A. Accordingly, it is possible further to reduce the leakage current when a voltage is applied in the reverse direction.

Furthermore, when a voltage is applied in the reverse direction, since the conduction electrons which have accumulated on the polycrystalline silicon layer 3A side of the polycrystalline silicon/silicon carbide hetero junction interface shield the electric field, accordingly the electric field exerts hardly any influence upon the polycrystalline silicon layer 3A. In other words, almost all of the reverse bias voltage comes to be applied between the polycrystalline silicon/silicon carbide hetero junction interface and the metal electrode 4. Due to this, no insulation breakdown in the insulation layer such as the oxide film 38 or the like occurs, even when a voltage is applied in the reverse direction. Accordingly, the insulation between the polycrystalline silicon layer 3A and the Schottky electrode 34 is maintained in good condition. In this state, since the electric potential of the polycrystalline silicon layer 3A is fixed at almost the same electrical potential as that of the Schottky electrode 34, even though the Schottky electrode 34 and the polycrystalline silicon layer 3A are in the mutually insulated state due to the provision of the insulating layer such as the oxide film 38 or the like, it is possible to obtain the same reverse bias voltage capability as in the case in which they are not insulated from one another.

Method of Manufacture of the High Reverse Voltage Silicon Carbide Diode According to the Ninth Preferred Embodiment Next, using FIG. 26, a manufacturing process according to the present invention for this high reverse voltage silicon carbide diode in the ninth preferred embodiment will be explained with reference to FIGS. 28A through 28D and FIGS. 29A and 29B.

Figure 28A:
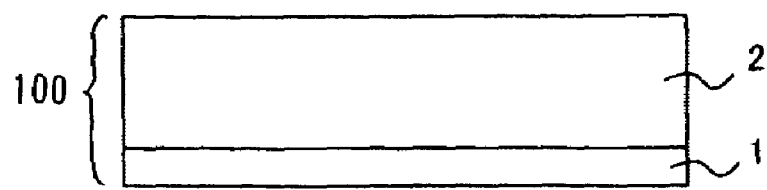
FIGS. 28A through 28D are cross sectional process views showing a method of manufacture of the semiconductor device according to the ninth preferred embodiment of the present invention.

First, as shown in FIG. 28A, an N type silicon carbide base layer 100 is prepared by forming an N type low concentration silicon carbide epitaxial layer 2 upon a first main surface of an N type high concentration silicon carbide substrate 1.

Figure 28B:
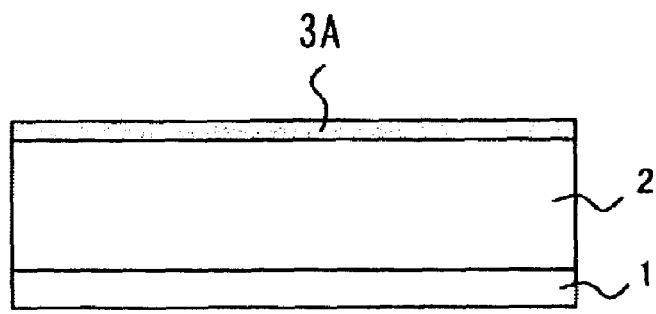

Next, as shown in FIG. 28B, after depositing the polycrystalline silicon layer 3A upon this epitaxial layer 2, the desired impurity is introduced into this polycrystalline silicon layer 3A. In this process of introducing the impurity into this polycrystalline silicon layer 3A, a solid phase diffusion method is available. In the solid phase diffusion method, a deposition layer doped at high impurity concentration is formed on the polycrystalline silicon layer 3A and the impurity is introduced into the polycrystalline silicon layer 3A by diffusion from the deposition layer as a source of diffusion. Furthermore, it would also be acceptable to introduce the impurity through a screen film into the polycrystalline silicon layer 3A by ion implantation method. Yet further, it would also be possible to introduce the impurity from the vapor phase. In this case, it is possible to utilize a per se conventional vapor phase diffusion method. In concrete terms, the impurity is introduced in a diffusion furnace as a gas along with a carrier gas. The proportion of the gas may be accurately controlled by a gas-mixing device which is equipped with a mass flow controller. For the carrier gas, generally an inert-gas such as argon or the like is employed. After this, heat processing is performed in a nitrogen atmosphere for about one minute at a temperature of about 1000° C., and the structure of the hetero junction interface is elaborated.

Figure 28C:
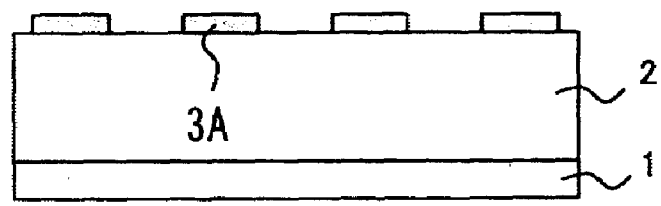

Next, the polycrystalline silicon layer 3A is patterned by photolithography and etching, and, as shown in FIG. 28C, the stripes of the polycrystalline silicon layer 3A are formed spaced apart at predetermined intervals.

Figure 28D:
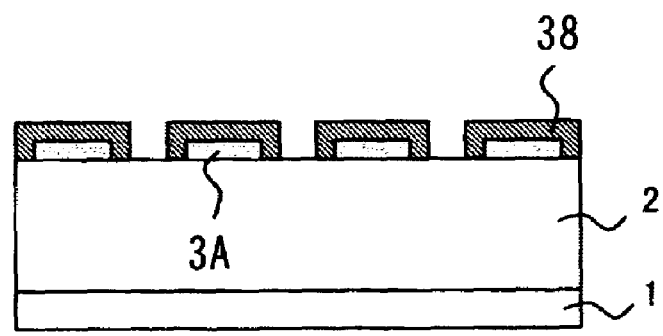

Next thermal oxidation is performed in an oxidizing atmosphere whose water vapor partial pressure is approximately 1.0, and, as shown in FIG. 28D, an oxide film 38 is formed upon the surface of the polycrystalline silicon layer 3A. Since at this time only the polycrystalline silicon layer 3A is oxidized, without oxidizing the portions of the epitaxial layer 2 which are exposed, it is possible to form the oxide film 38 only upon the surface of the polycrystalline silicon layer 3A spontaneously.

Figure 29A:
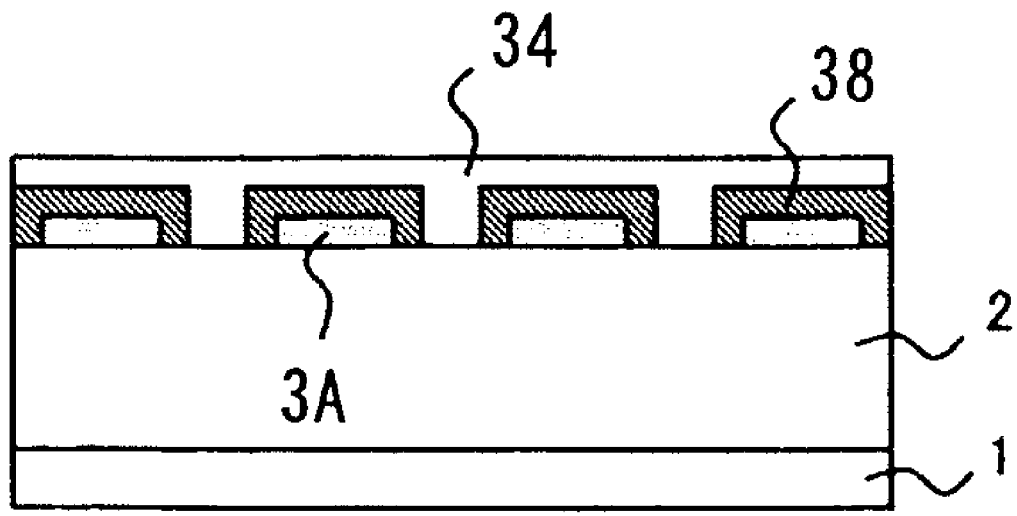
FIGS. 29A and 29B are cross sectional views showing a manufacturing process subsequent to the manufacturing process which is shown in FIGS. 28A through 28D.

Next, as shown in FIG. 29A, a Schottky electrode 34 is formed by depositing layers of titanium and aluminum in order by a spattering method, so as to contact with the tops of the portions of the epitaxial layer 2 which remain exposed, while being insulated from the tops of the stripes of the polycrystalline silicon layer 3A by the oxide film 38.

Figure 29B:
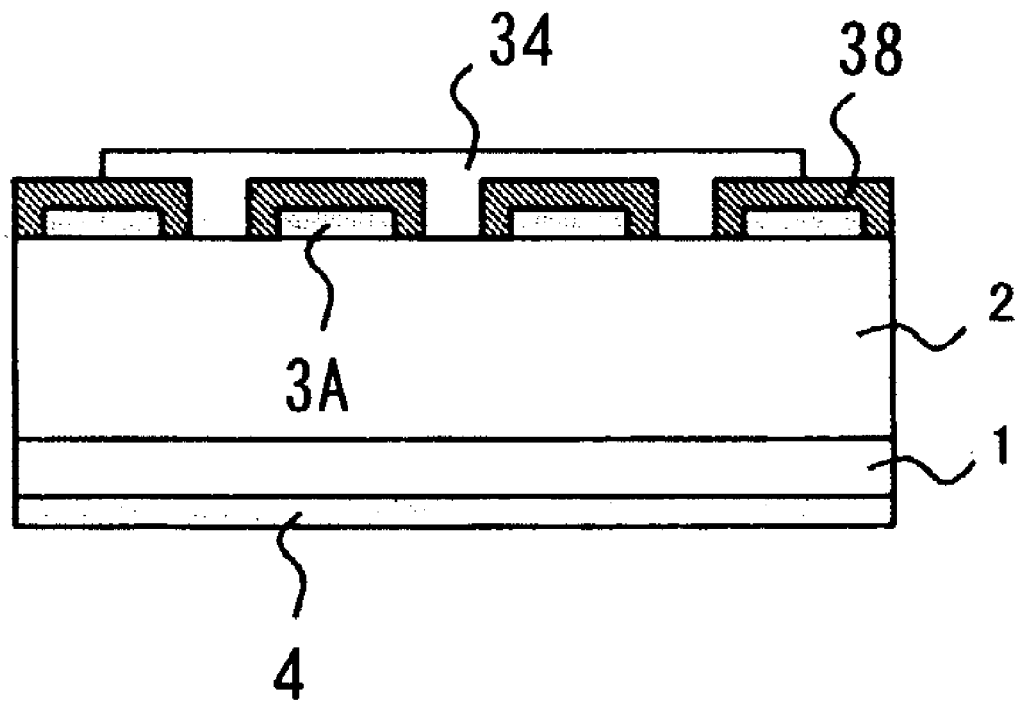

Next, as shown in FIG. 29B, the Schottky electrode 34 which is made of titanium and aluminum is patterned by photolithography and by etching so that the periphery of the Schottky electrode 34 is terminated at the polycrystalline silicon layer 3A. After this, a titanium layer and an aluminum layer are formed in order by a spattering method upon the rear surface of the silicon carbide substrate 1, so as to serve as the metal electrode 4, and thereby the high reverse voltage silicon carbide diode is produced.

When a voltage is applied in the reverse direction to the high reverse voltage silicon carbide diode manufactured in the above manner, in addition to the beneficial result that it is possible to moderate the electric field intensity at the Schottky junction interface at the outermost peripheral portion of the Schottky electrode effectively and to reduce the leakage current, it is also possible to prevent leakage current between the Schottky electrode 34 and the polycrystalline silicon layer 3A, since the Schottky electrode 34 and the polycrystalline silicon layer 3A are mutually insulated from one another. Accordingly, it is possible further to enhance the OFF characteristics when a voltage is applied in the reverse direction. According to the method of manufacture of the above described type of insulating layer which includes, for example, the process of forming the oxide film 38, it is possible to manufacture a high reverse voltage silicon carbide diode which is endowed with the above described beneficial properties.

Furthermore, when the oxide film 38 which is formed by thermal oxidation of the polycrystalline silicon layer 3A performed in an oxidizing atmosphere whose water vapor partial pressure is approximately 1.0 is used as the insulating layer which provides insulation between the Schottky electrode 34 and the polycrystalline silicon layer 3A, then it is possible to form this oxide film 38 only upon the surface of the polycrystalline silicon layer 3A spontaneously, since only the polycrystalline silicon layer 3A is oxidized without the exposed portions of the silicon carbide epitaxial layer 2 being oxidized. Accordingly, a process of manufacturing the high reverse voltage silicon carbide diode described above is simplified.

The above described embodiments are examples, and various modifications can be made without departing from the spirit and scope of the invention. For example, in the case of the high reverse voltage silicon carbide diodes according to the first through the ninth preferred embodiments of the present invention, it would be possible to utilize other polytypes of silicon carbide than the 4H polytype, such as the 6H or the 3C polytypes or the like. Furthermore, although the present invention has been explained in terms of the use of polycrystalline silicon as the second semiconductor layer, it would also be possible to utilize some other semiconductor material, provided that such a material was capable of forming a hetero junction with silicon carbide.

Moreover, although in the above explanation of the first through the ninth preferred embodiments of the present invention the use of N type silicon carbide was described for the silicon carbide epitaxial layer 2, and the use of N type polycrystalline silicon was described for the polycrystalline silicon layer 3, this is not intended to be limitative of the present invention; it would also be possible to utilize various other combinations, such as N type silicon carbide and P type polycrystalline silicon, P type silicon carbide and P type polycrystalline silicon, P type silicon carbide and N type polycrystalline silicon, or non doped polycrystalline silicon or the like.

With the high reverse voltage silicon carbide diode according to the ninth preferred embodiment of the present invention, the Schottky electrode 34 was formed so as to contact with the portions of the epitaxial layer 2 which were exposed, while being insulated from the polycrystalline silicon layer 3A by the oxide film 38. Although in that case the polycrystalline silicon layer 3A was formed over the first main surface of the epitaxial layer 2, as shown in FIG. 24, it would also be possible to provide the oxide film 38 so as to insulate between a polycrystalline silicon layer 3A which was formed by being laid in the interiors of trenches 36, and the Schottky electrode 34.

Furthermore, although the high reverse voltage silicon carbide diodes in the first through the ninth preferred embodiments according to the present invention have been described above in terms of utilizing a silicon carbide base layer as the first semiconductor base layer, this was only by way of example: it would also be possible to utilize some semiconductor material other than silicon carbide which is capable of forming a high reverse voltage diode, such as silicon, gallium arsenide, gallium nitride, diamond or the like.

The present patent application is based upon the Japanese patent applications identified below, and the contents thereof are incorporated herein by reference:
Japanese Patent Application 2002-41667, filed Feb. 19, 2002;
Japanese Patent Application 2002-41729, filed Feb. 19, 2002;
Japanese Patent Application 2002-288500, filed Oct. 1, 2002; and
Japanese Patent Application 2002-297032, filed Oct. 10, 2002.

What is claimed is:

1. A high reverse voltage diode comprising a first semiconductor layer, which is a silicon carbide layer having a first band gap and is provided to achieve ohmic contact with a cathode, and a second semiconductor layer which forms an anode and has a second band gap overlying said first semiconductor layer forming a hetero junction between said first and second semiconductor layers, wherein said first and second band gaps are different.

2. A high reverse voltage diode according to claim 1, wherein:
the hetero junction is provided between a first main surface side of the first semiconductor layer and the second semiconductor layer, and further comprising a metal electrode which is formed on the first main surface side of the first semiconductor layer without contacting with the second semiconductor layer.

3. A high reverse voltage diode according to claim 1, wherein:
the second semiconductor layer has one of regions which contain impurity of different types and regions which contain an impurity in different concentration.

4. A high reverse voltage diode according to claim 1, wherein:
one of the type of the impurity and the impurity concentration within a central portion of the second semiconductor layer is different from a peripheral portion of the second semiconductor layer; and
a breakdown voltage in the hetero junction at the peripheral portion is at least greater than a breakdown voltage in the hetero junction at the central portion.

5. A high reverse voltage diode according to claim 1, wherein:
at least one trench is formed in a first main surface side of the first semiconductor layer; and
the hetero junction is formed so as to follow along at least one of a bottom portion and a side wall portion of the trench.

6. A high reverse voltage diode according to claim 1, further comprising:
an electric field relaxation region, being arranged to contact with the hetero junction.

7. A high reverse voltage diode according to claim 1, further comprising:
an electric field relaxation region, being arranged at the periphery of the hetero junction.

8. A high reverse voltage diode according to claim 6, wherein:
the electric field relaxation region contacts with the second semiconductor layer; and
the impurity concentration of a portion in the second semiconductor layer which contacts with the electric field relaxation region is higher than the impurity concentration of another portion.

9. A high reverse voltage diode according to claim 1, wherein:
a hetero junction is provided in at least one place upon a first main surface of the first semiconductor layer, and a Schottky electrode which is made of metal is arranged over the first main surfaces of the second semiconductor layer and exposed portions of the first semiconductor layer.

10. A high reverse voltage diode according to claim 9, wherein:
a breakdown voltage at the hetero junction between the first semiconductor layer and the second semiconductor layer is greater than a breakdown voltage at a Schottky junction between the first semiconductor layer and the Schottky electrode.

11. A high reverse voltage diode according to claim 9, wherein:
the outermost peripheral portion of the Schottky electrode is terminated on the second semiconductor layer.

12. A high reverse voltage diode according to claim 9, wherein:
at least one place of a plurality of places in which the second semiconductor layer is formed upon the first main surface of the first semiconductor layer is insulated from the Schottky electrode by an insulating film.

13. A method of manufacturing a high reverse voltage diode defined in claim 9, comprising:
cleaning the first main surface side of the first semiconductor layer;

depositing the second semiconductor layer upon at least one place of the first main surface of the first semiconductor layer;

doping an impurity into the second semiconductor layer;

etching the second semiconductor layer selectively;

forming a Schottky electrode which is made of metal over the first main surfaces of the second semiconductor layer and exposed portions of the first semiconductor layer; and forming a metal electrode upon a second main surface of the first semiconductor layer, which is opposite from the first main surface.

14. A method of manufacturing a high reverse voltage diode according to claim 13, wherein:

in a process of forming the second semiconductor layer, a trench is formed in at least one place upon the first main surface of the first semiconductor layer and the second semiconductor layer is formed in the interior of the trench.

15. A method of manufacturing a high reverse voltage diode according to claim 13, further comprising:

performing heat processing at a temperature equal to or less than 1300° C. between the process of forming the second semiconductor layer and the process of forming the Schottky electrode made of metal.

16. A method of manufacturing a high reverse voltage diode according to claim 13, further comprising:

forming an insulating film to insulate the second semiconductor layer from the Schottky electrode.

17. A method of manufacturing a high reverse voltage diode according to claim 16, wherein:

an oxide layer which is formed by thermal oxidation of the second semiconductor layer in an oxidizing atmosphere whose water vapor partial pressure is 1.0 is used as the insulating film.

18. A high reverse voltage diode according to claim 1, wherein:

a trench is provided in at least one place upon a first main surface of the first semiconductor layer, the second semiconductor layer is provided in the interior of the trench, and a Schottky electrode which is made of metal is arranged over the first main surfaces of the second semiconductor layer and exposed portions of the first semiconductor layer.

19. A high reverse voltage diode according to claim 18, wherein:

a breakdown voltage at the hetero junction between the first semiconductor layer and the second semiconductor layer is greater than a breakdown voltage at a Schottky junction between the first semiconductor layer and the Schottky electrode.

20. A high reverse voltage diode according to claim 18, wherein:

the outermost peripheral portion of the Schottky electrode is terminated on the second semiconductor layer.

21. A high reverse voltage diode according to claim 18, wherein:

at least one place of a plurality of places in which the second semiconductor layer is formed upon the first main surface of the first semiconductor layer is insulated from the Schottky electrode by an insulating film.

22. The high reverse voltage diode of claim 1, wherein said first band gap is wider than said second band gap.

23. The high reverse voltage diode of claim 1, wherein said second semiconductor layer is a silicon semiconductor layer comprising single crystal silicon, amorphous silicon, or polycrystalline silicon.

24. The high reverse voltage diode of claim 23, wherein said second semiconductor layer comprises doped silicon.

25. The high reverse voltage diode of claim 1, further comprising a metal electrode which is formed on an opposite side of the first semiconductor layer from said second semiconductor layer.

26. The high reverse voltage diode of claim 1, wherein said first and second semiconductor layers are the same conductivity type.

27. The high reverse voltage diode of claim 1, wherein said second semiconductor layer has a thickness in the range of a few tens of angstroms to a few thousand angstroms.

28. The high reverse voltage diode of claim 1, wherein said second semiconductor layer comprises single crystal silicon, amorphous silicon, or polycrystalline silicon and said hetero junction has a reverse bias capability of approximately 900 V or greater.

29. The high reverse voltage diode of claim 1, wherein said second semiconductor layer has a thickness in the range of a few tens of angstroms to a few thousand angstroms, and said diode is not a PN junction diode.

30. A method of manufacturing a high reverse voltage diode comprising a first semiconductor layer, which is a silicon carbide layer having a first band gap, and a second semiconductor layer having a second band gap overlying said first semiconductor layer forming a hetero junction between said first and second semiconductor layers, wherein said first and second band gaps are different, comprising:

cleaning a first main surface side of the first semiconductor layer;

depositing the second semiconductor layer upon the first main surface of the first semiconductor layer;

doping an impurity into the second semiconductor layer; and etching the second semiconductor layer selectively.

31. The method of manufacturing a high reverse voltage diode according to claim 30, further comprising:

performing heat processing at a temperature equal to or less than 1300° C. after depositing the second semiconductor layer.

32. A method of manufacturing a high reverse voltage diode according to claim 30, further comprising:

forming a trench upon a portion of the first main surface side of the first semiconductor layer before cleaning the first main surface side of the first semiconductor layer; and depositing the second semiconductor layer in the trench after cleaning the first main surface side of the first semiconductor layer.

33. The method of manufacturing a high reverse voltage diode according to claim 30, wherein:

the process of doping an impurity comprises at least one of the methods of: doping an impurity from a deposition layer which has been doped with impurity at high concentration;

doping an impurity by ion implantation; and doping an impurity from the vapor phase.

34. A high reverse voltage diode comprising a first semiconductor layer, which is a silicon carbide layer having a first band gap and is provided to achieve ohmic contact with a cathode, and a second semiconductor layer which is provided to achieve ohmic contact with an anode and has a second band gap overlying said first semiconductor layer forming a hetero junction between said first and second semiconductor layers, wherein said first and second band gaps are different.

35. The high reverse voltage diode of claim 34, wherein said first band gap is wider than said second band gap.

36. The high reverse voltage diode of claim 34, wherein said second semiconductor layer is a silicon semiconductor layer comprising single crystal silicon, amorphous silicon, or polycrystalline silicon.

37. The high reverse voltage diode of claim 36, wherein said second semiconductor layer comprises doped silicon.

38. The high reverse voltage diode of claim 34, further comprising a metal electrode which is formed on an opposite side of the first semiconductor layer from said second semiconductor layer.

39. The high reverse voltage diode of claim 34, wherein said first and second semiconductor layers are the same conductivity type.

40. The high reverse voltage diode of claim 34, wherein said second semiconductor layer comprises single crystal silicon, amorphous silicon, or polycrystalline silicon and said hetero junction has a reverse bias capability of approximately 900 V or greater.

41. The high reverse voltage diode of claim 34, wherein said second semiconductor layer has a thickness in the range of a few tens of angstroms to a few thousand angstroms, and said diode is not a PN junction diode.

* * * * *